United States Patent
Yang et al.

(10) Patent No.: US 8,215,969 B2
(45) Date of Patent: Jul. 10, 2012

(54) CONTACT STRUCTURE AND FORMING METHOD THEREOF AND CONNECTING STRUCTURE THEREOF

(75) Inventors: Sheng-Shu Yang, Hsinchu (TW); Shyh-Ming Chang, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, New Taipei (TW); Chi Mei Optoelectronics Corporation, Tainan County (TW); Industrial Technology Research Institute, Hsinchu (TW); TPO Displays Corp., Miao-Li County (TW)

( * ) Notice: Subject to any disclaimer, the term of this patent is extended or adjusted under 35 U.S.C. 154(b) by 221 days.

(21) Appl. No.: 12/144,658

(22) Filed: Jun. 24, 2008

(65) Prior Publication Data
US 2009/0246988 A1  Oct. 1, 2009

(30) Foreign Application Priority Data
Mar. 27, 2008 (TW) ................. 97111020 A

(51) Int. Cl.
*H01R 4/58* (2006.01)
(52) U.S. Cl. ............... 439/86; 439/931; 439/91
(58) Field of Classification Search ........... 439/66, 439/91, 81, 931, 86
See application file for complete search history.

(56) References Cited

U.S. PATENT DOCUMENTS

| | | | |
|---|---|---|---|
| 3,842,189 A | 10/1974 | Southgate | |
| 5,707,902 A * | 1/1998 | Chang et al. | 438/614 |
| 5,944,537 A | 8/1999 | Smith et al. | |
| 6,084,301 A | 7/2000 | Chang et al. | |
| 6,273,189 B1 | 8/2001 | Gissler et al. | |
| 6,696,319 B2 | 2/2004 | Frankowsky et al. | |
| 6,807,064 B2 | 10/2004 | Hedler et al. | |
| 6,998,703 B2 | 2/2006 | Di Stefano | |
| 7,166,920 B2 * | 1/2007 | Saito et al. | 257/738 |
| 7,246,432 B2 * | 7/2007 | Tanaka et al. | 29/846 |
| 7,408,260 B2 * | 8/2008 | Fjelstad et al. | 257/734 |
| 2005/0236104 A1 * | 10/2005 | Tanaka | 156/308.2 |

FOREIGN PATENT DOCUMENTS

| | | |
|---|---|---|
| CN | 1132931 | 10/1996 |
| CN | 1584672 | 2/2005 |
| CN | 101170089 | 4/2008 |
| TW | 200522286 | 7/2005 |
| TW | I237858 | 8/2005 |

OTHER PUBLICATIONS

"1st Office Action of China Counterpart Application", issued on Jun. 10, 2010, p. 1-p. 7, in which the listed references were cited.
"Office Action of Taiwan Counterpart Application", issued on Feb. 20, 2012, p1-p8, in which the listed references, Ref.1 and Ref.2, were cited.

* cited by examiner

*Primary Examiner* — Tulsidas C Patel
*Assistant Examiner* — Travis Chambers
(74) *Attorney, Agent, or Firm* — Jianq Chyun IP Office

(57) ABSTRACT

A contact structure disposed on a substrate is provided. The contact structure includes a pad, a polymer bump and a conductive layer. The pad is on the substrate. The polymer bump having a curve surface and a steep surface connecting with the curve surface is disposed on the substrate. The polymer bump is covered by the conductive layer and the conductive layer is electrically connected with the pad.

42 Claims, 45 Drawing Sheets

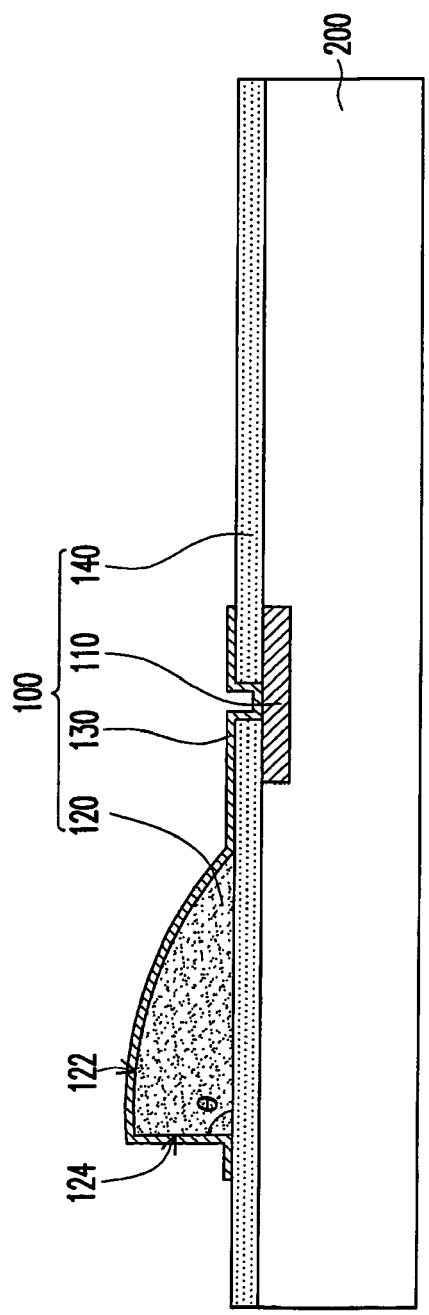
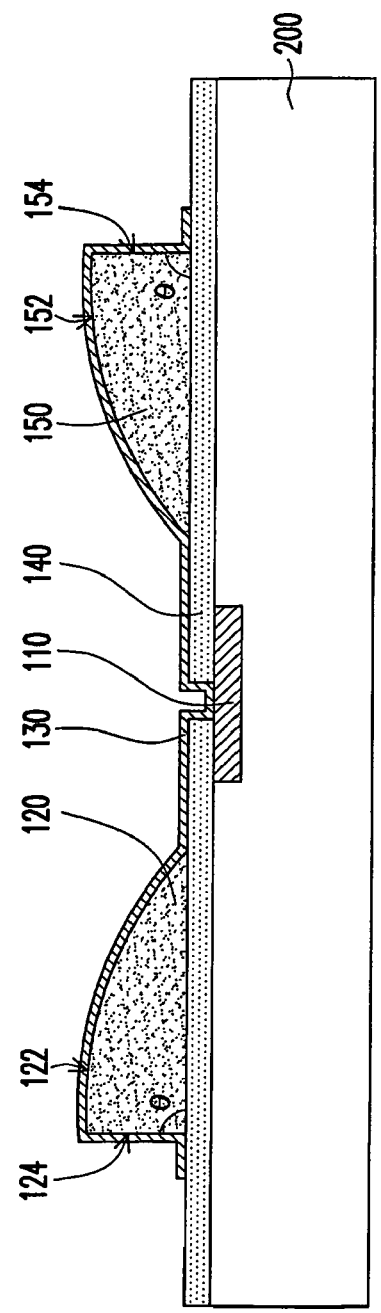

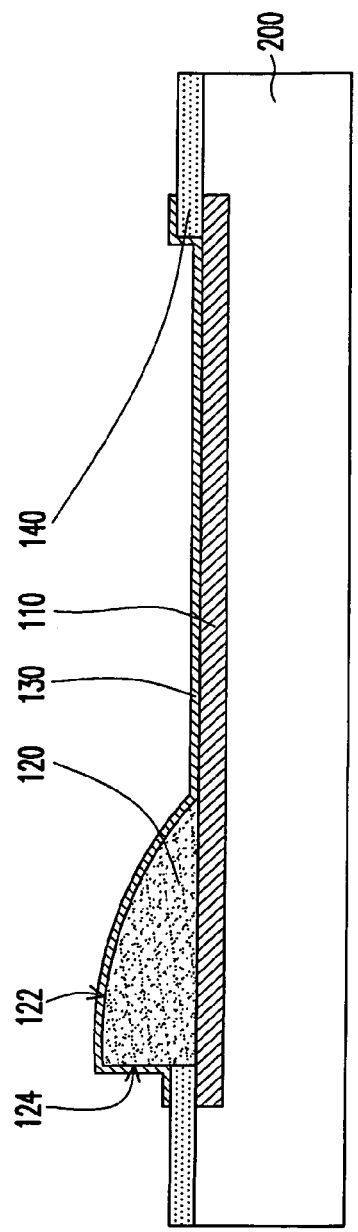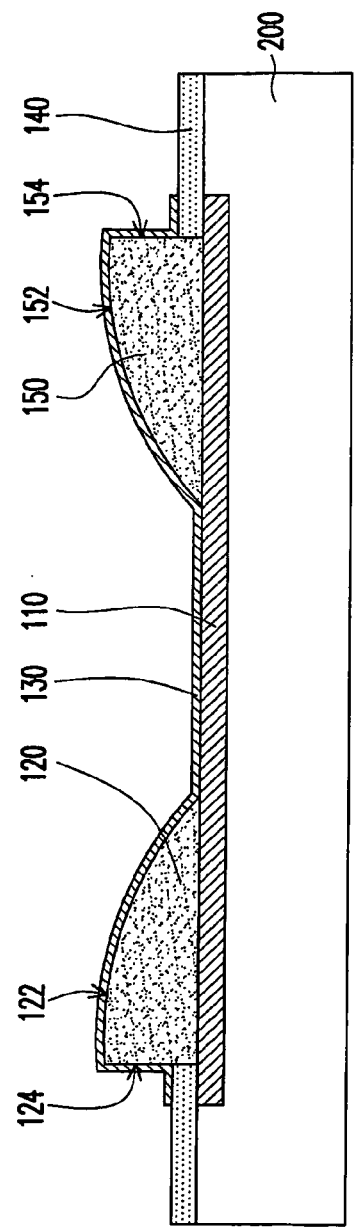

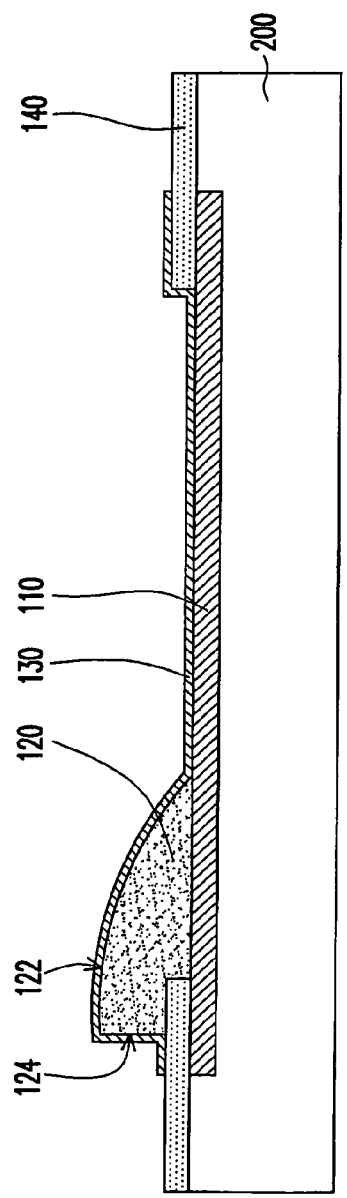
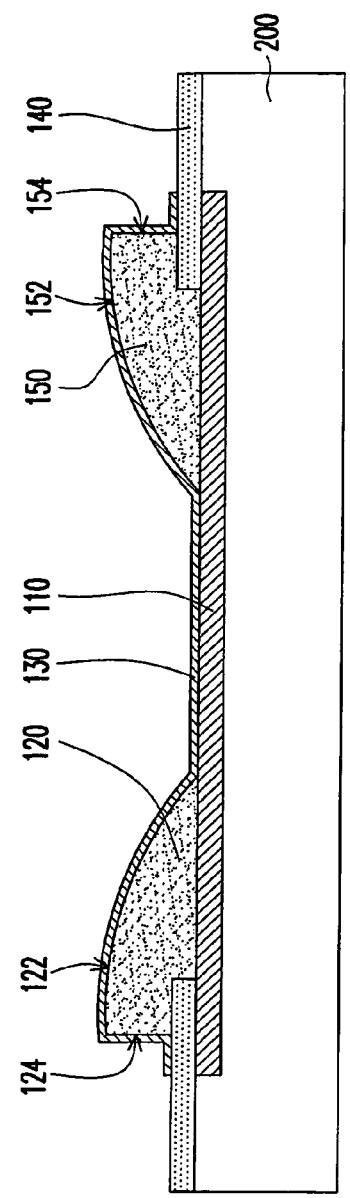

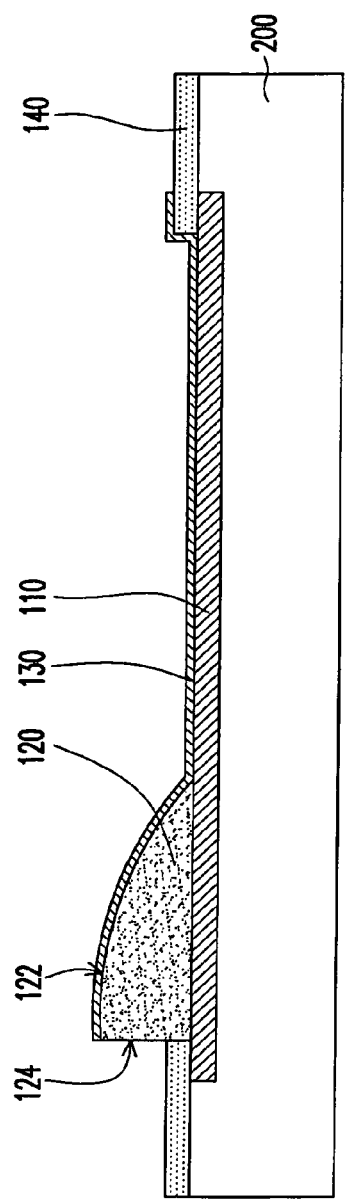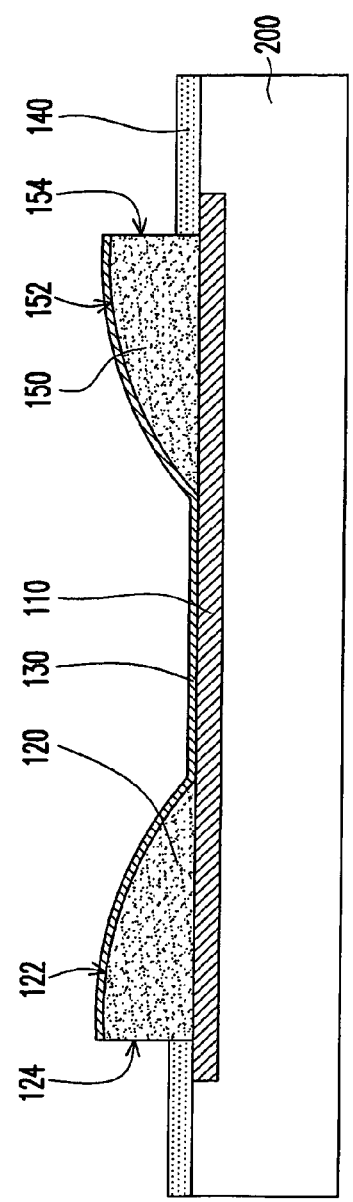
FIG. 9
FIG. 10

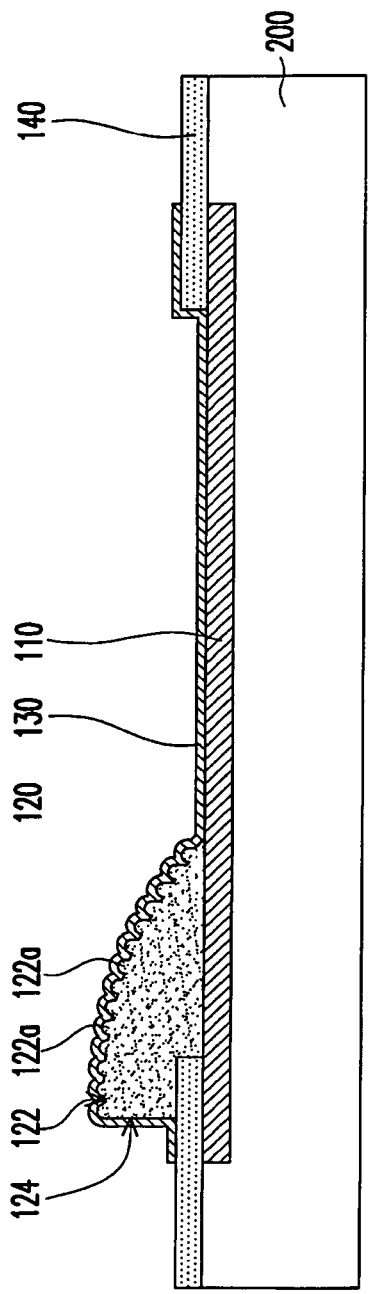
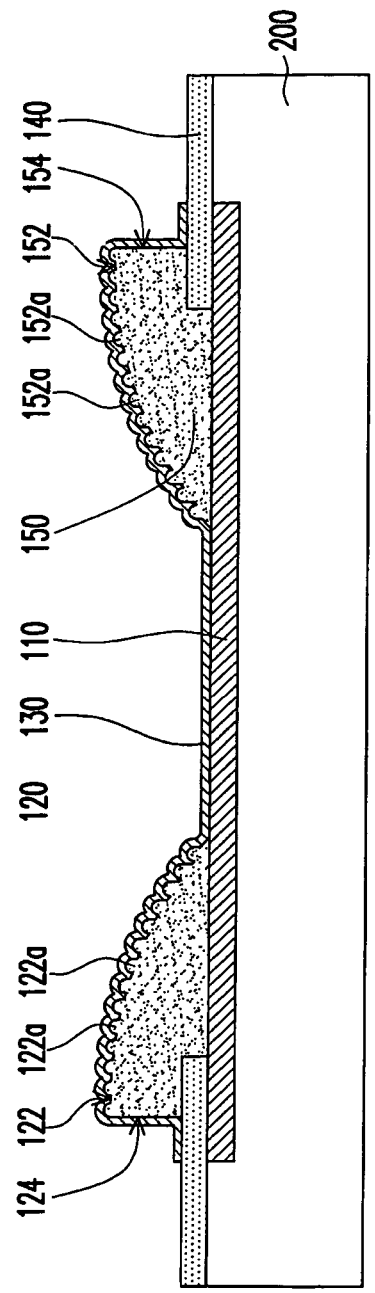

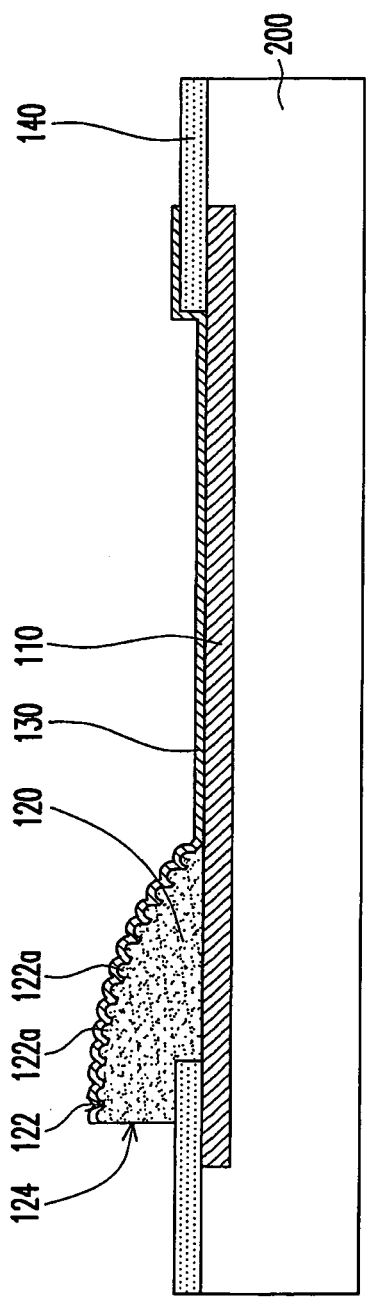
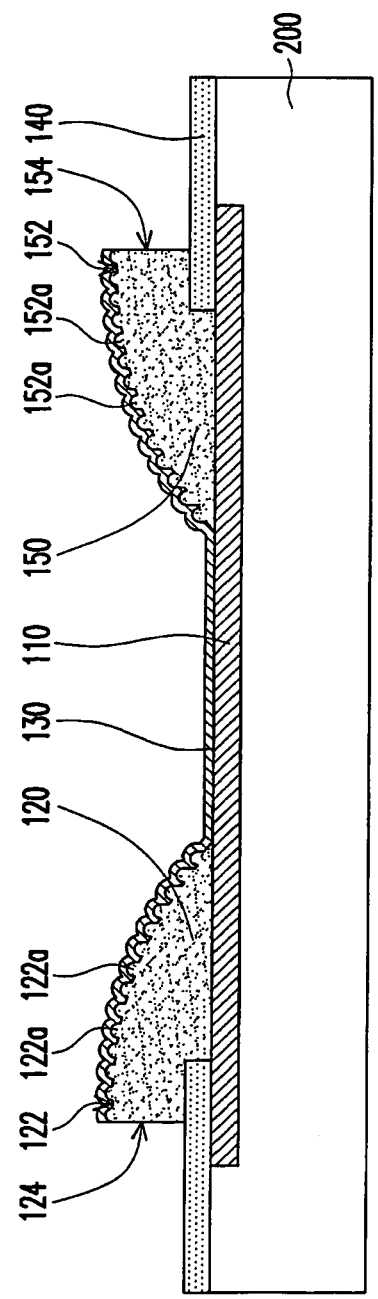
FIG. 23
FIG. 24

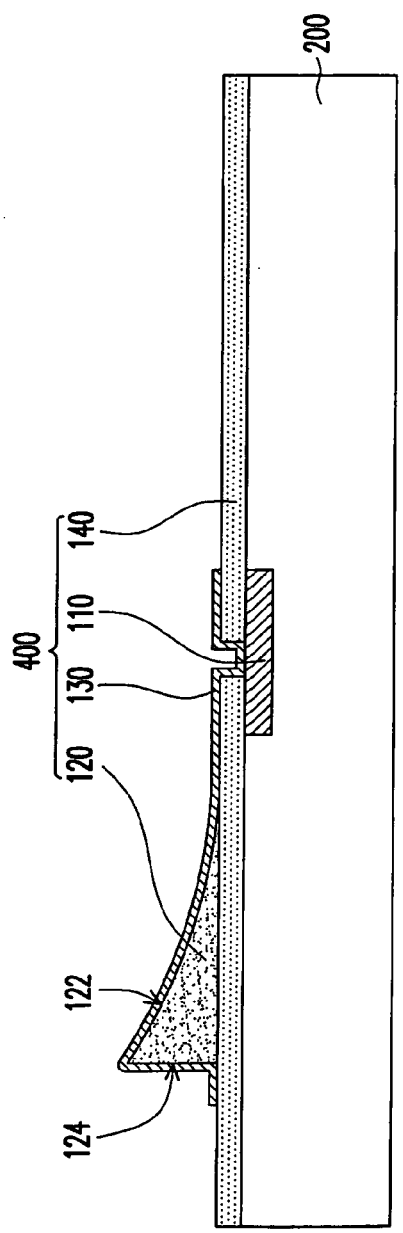
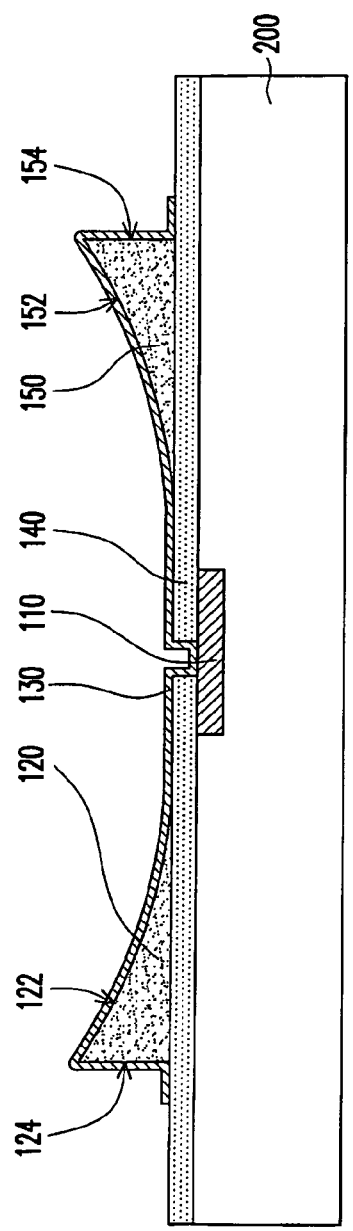
FIG. 25
FIG. 26

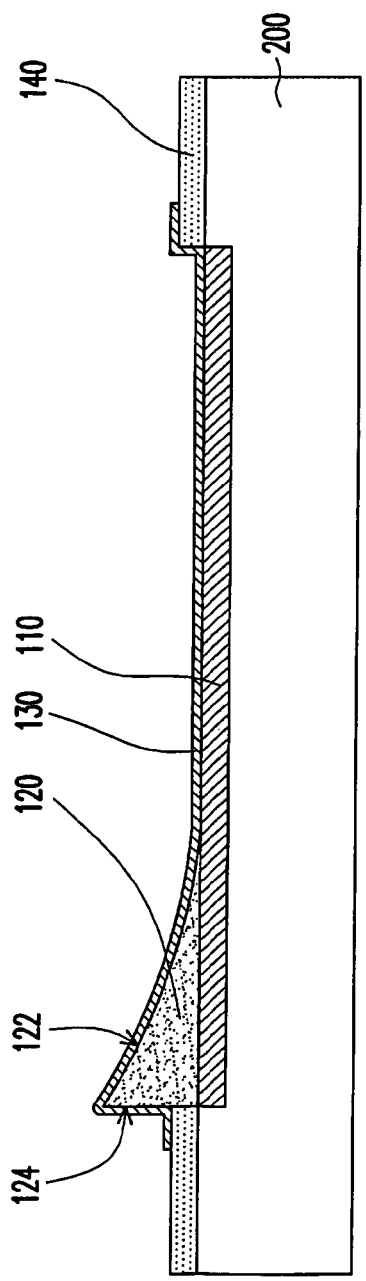
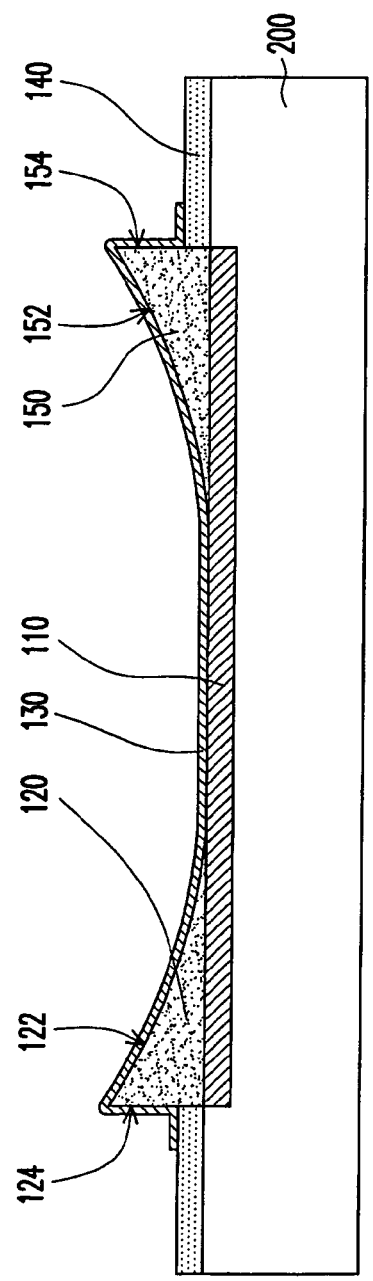

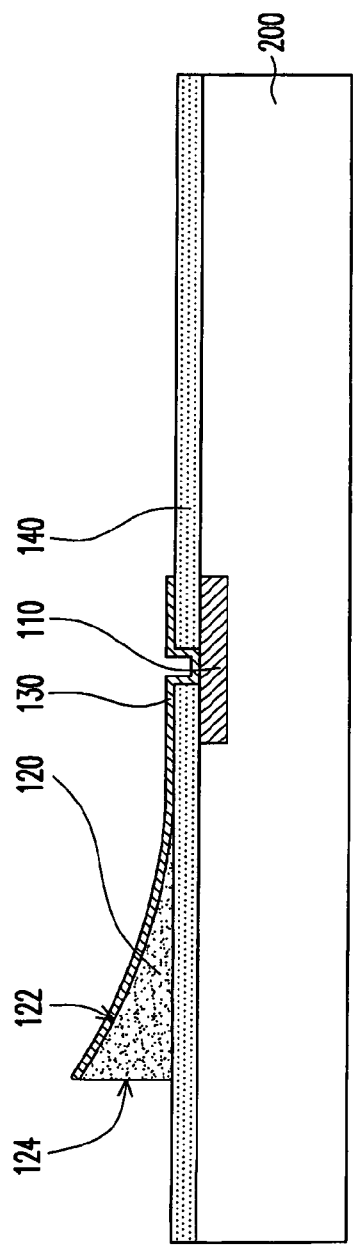
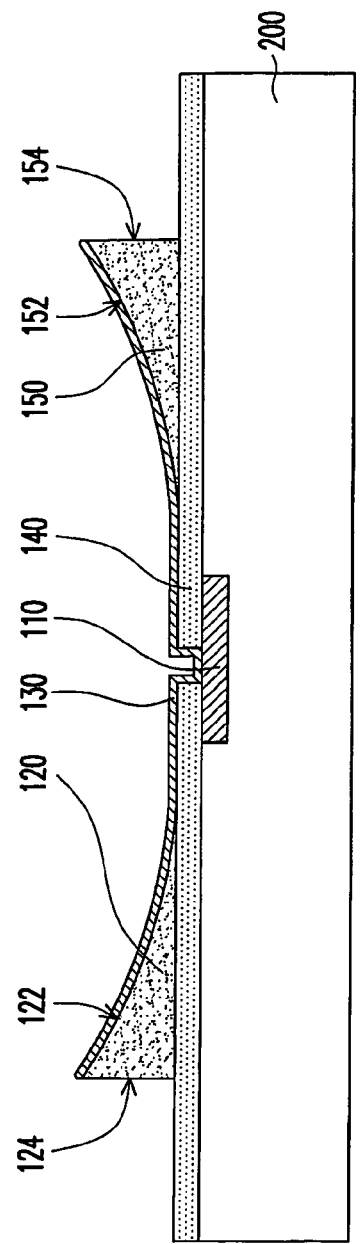
FIG. 31
FIG. 32

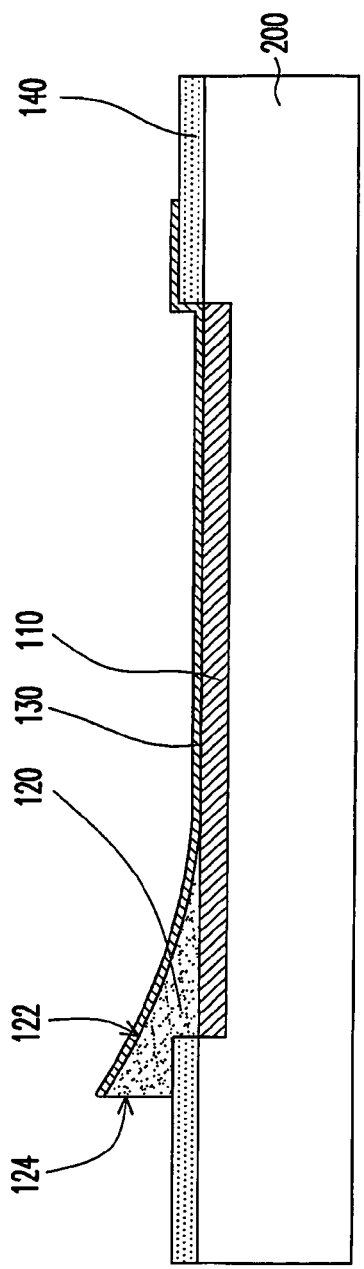
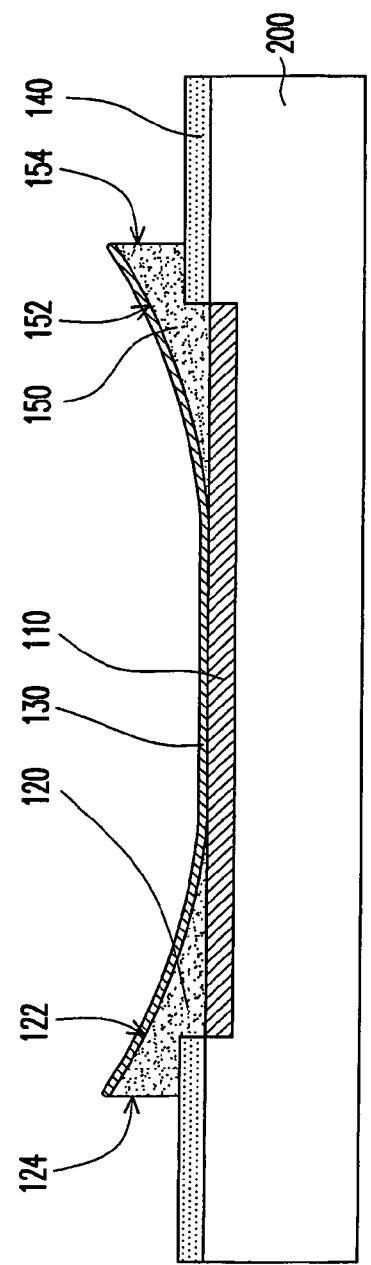

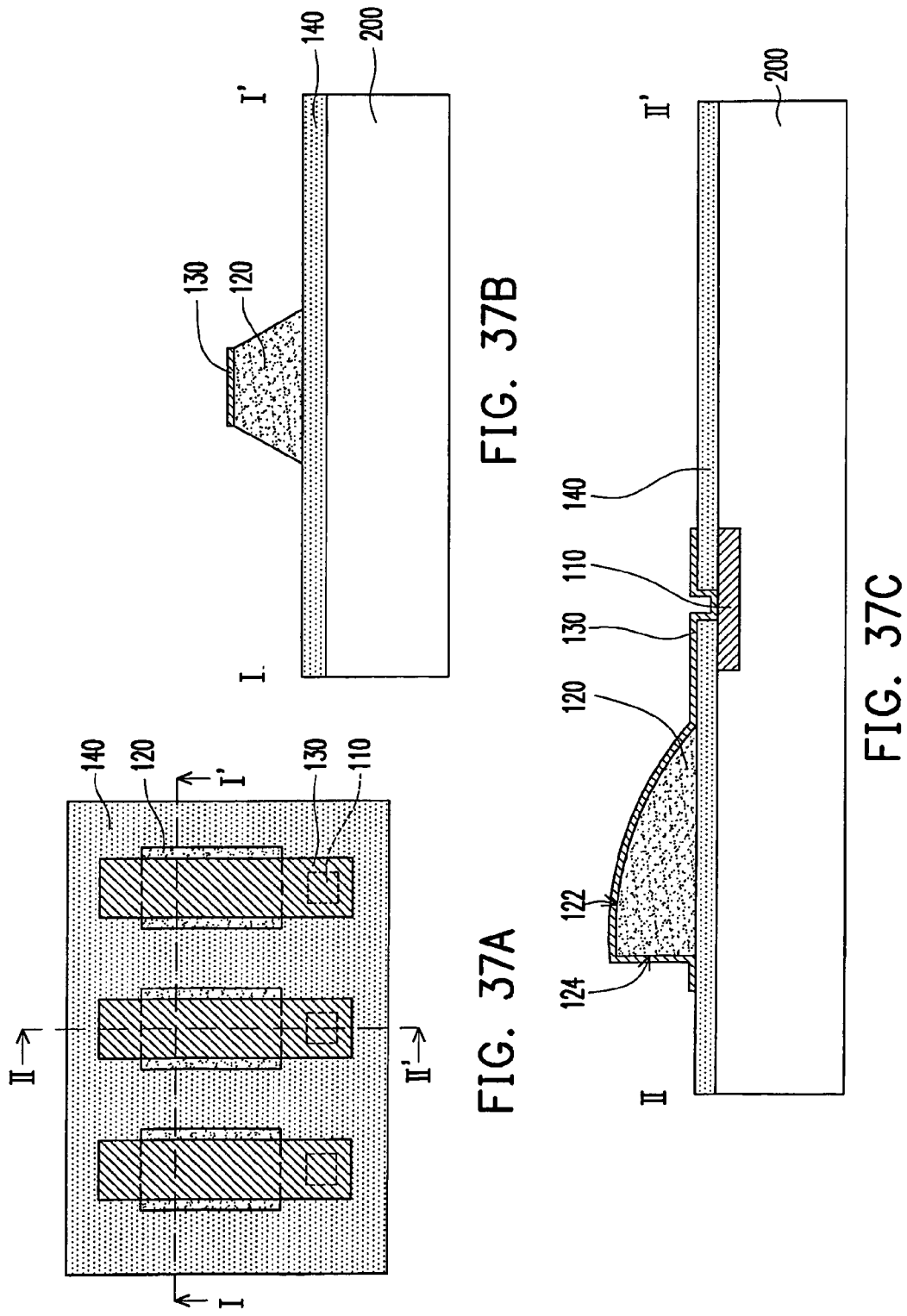

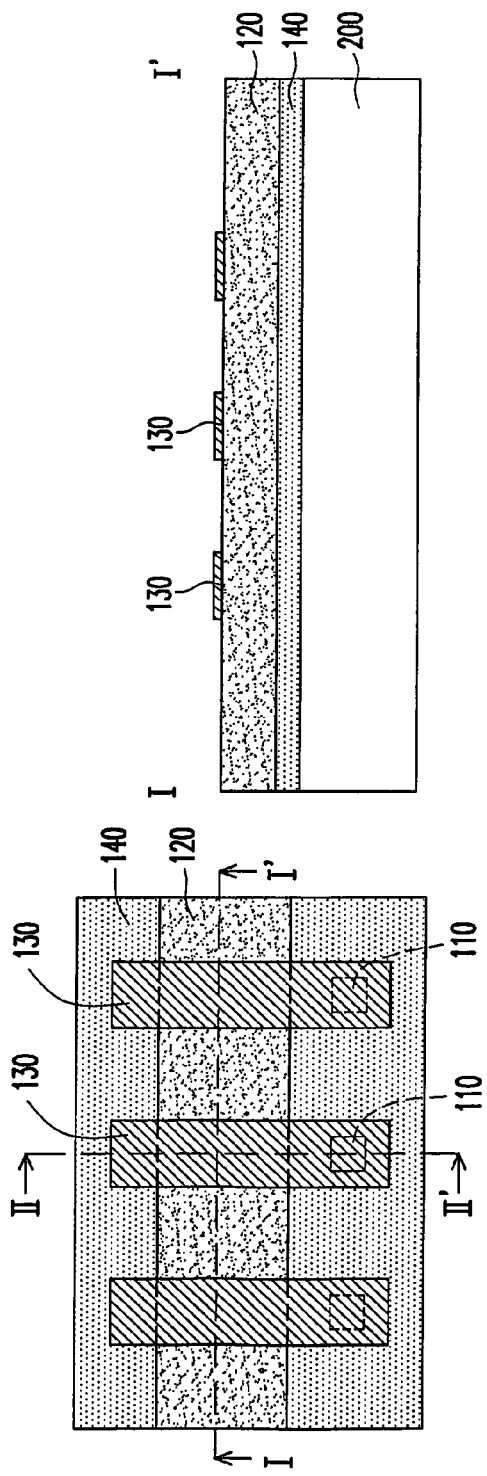
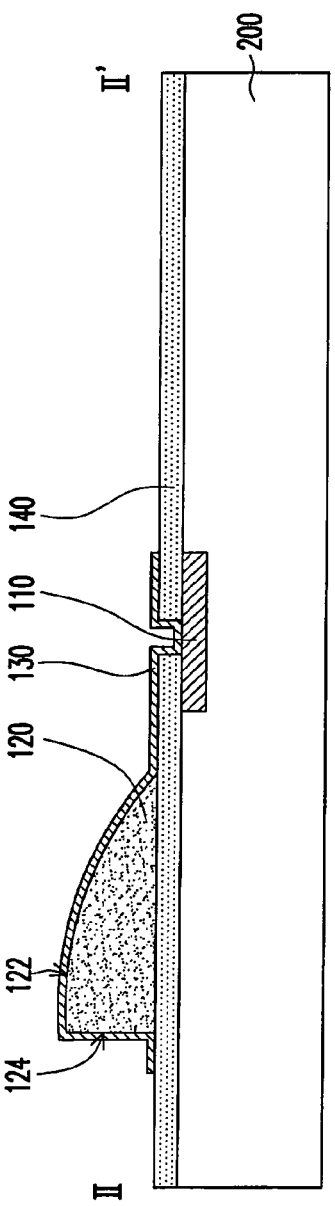
FIG. 38A
FIG. 38B
FIG. 38C

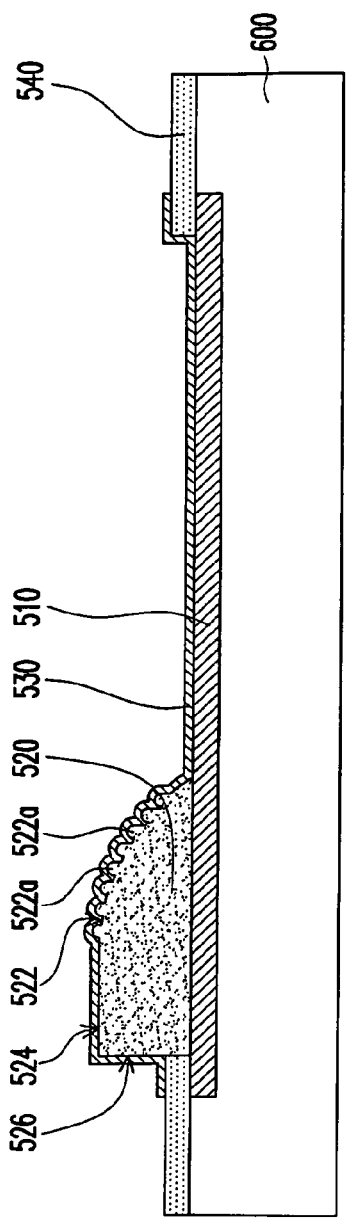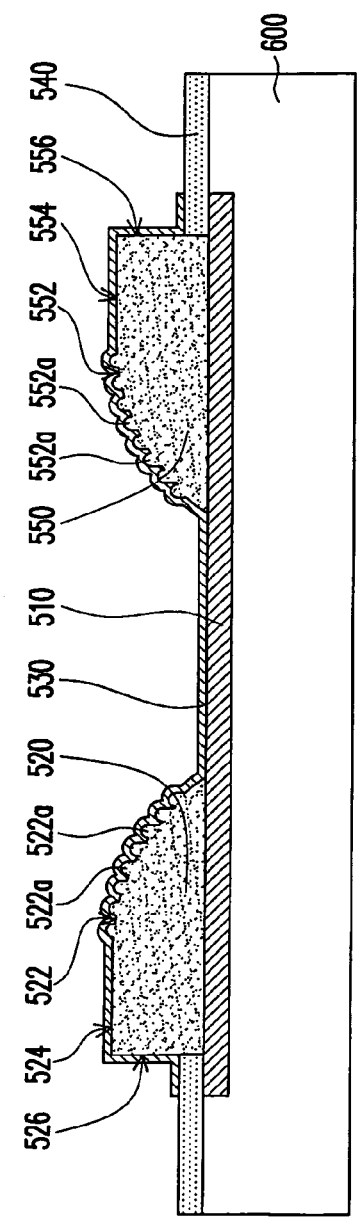

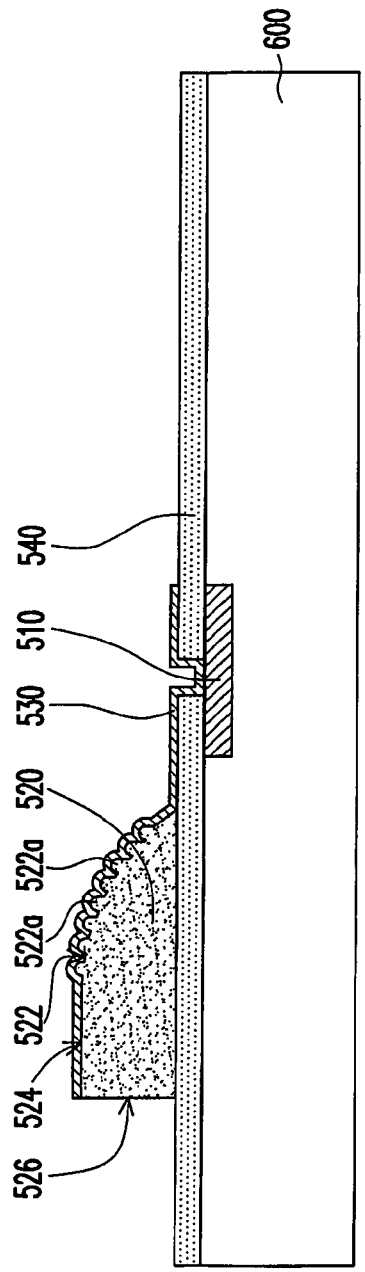
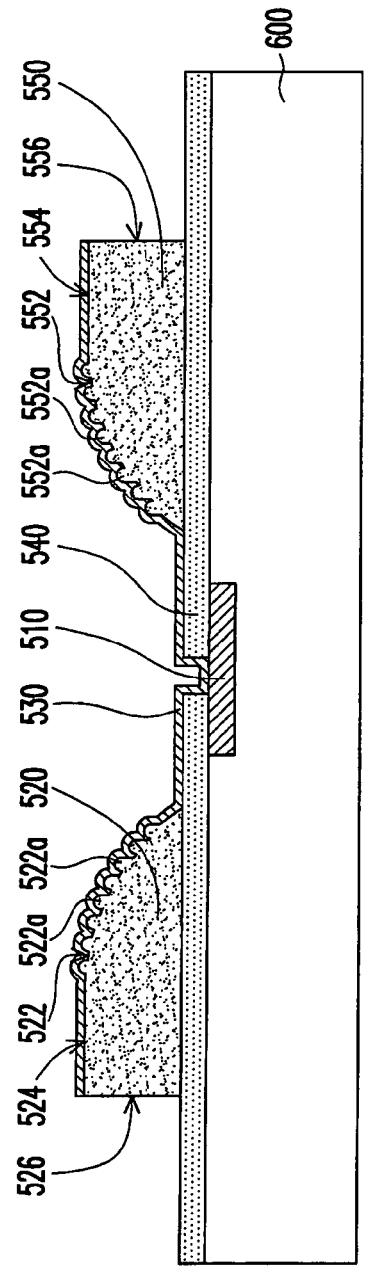
FIG. 46
FIG. 47

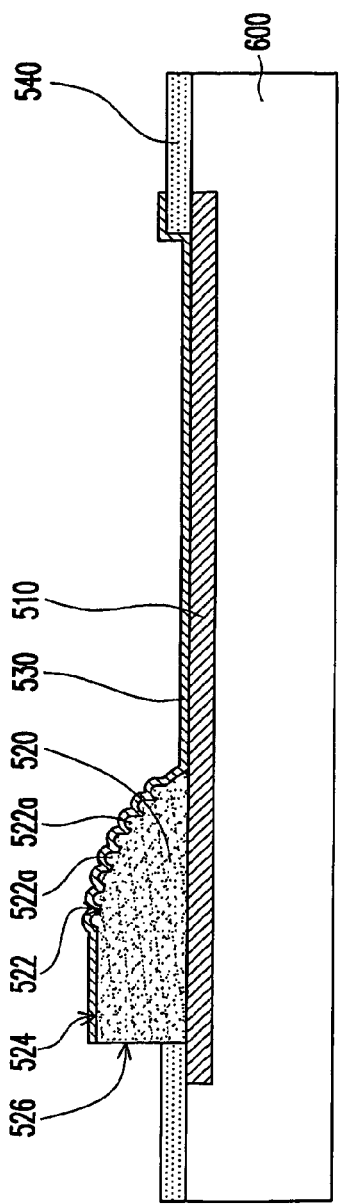
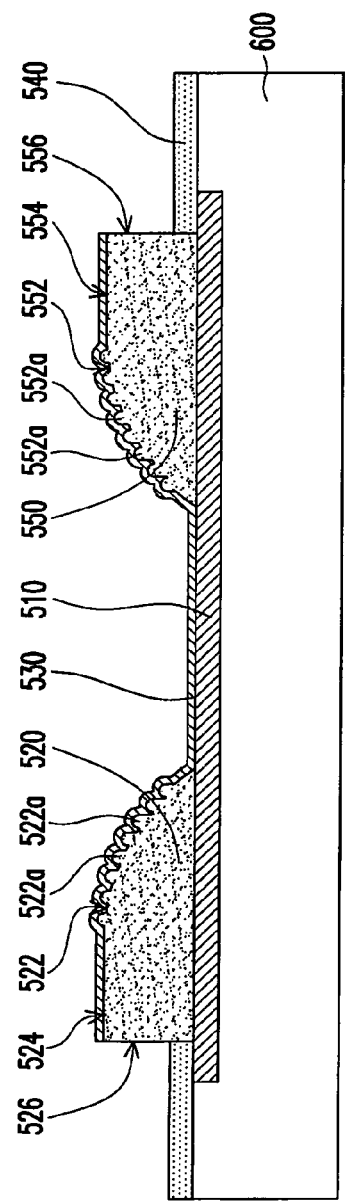
FIG. 48
FIG. 49

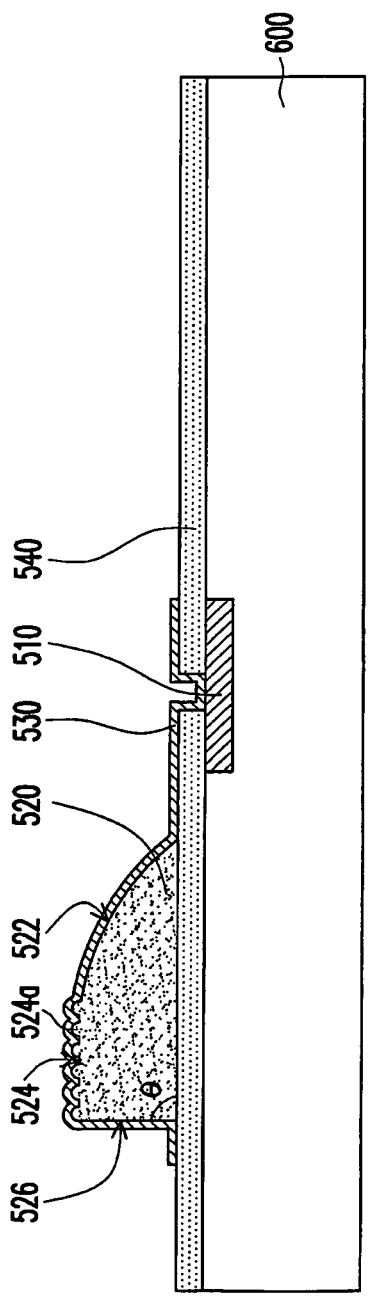
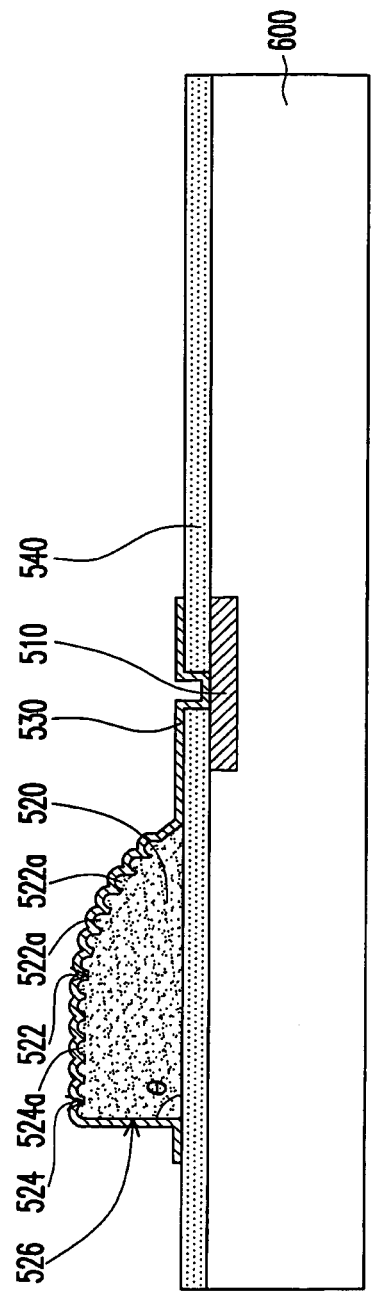

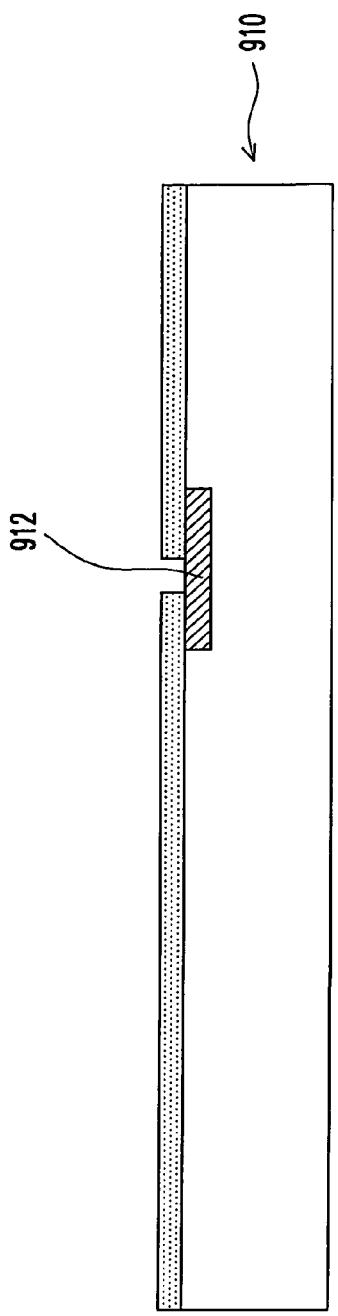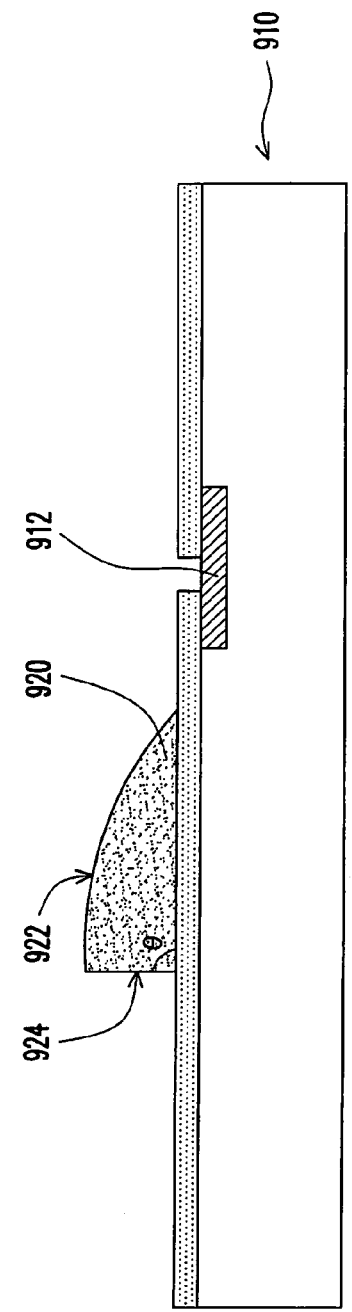

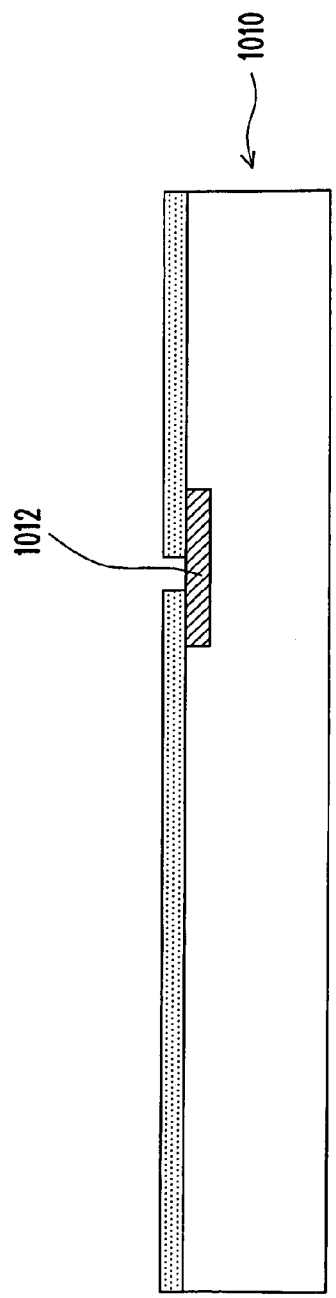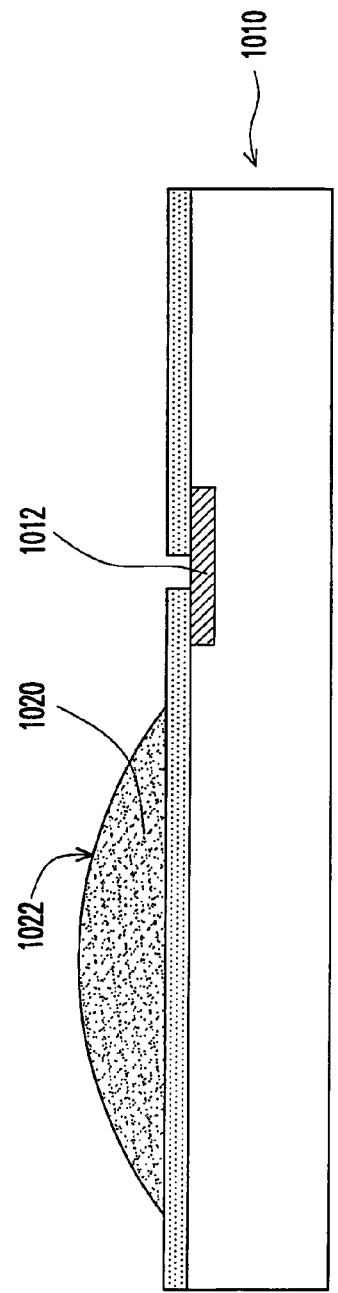
FIG. 63A
FIG. 63B

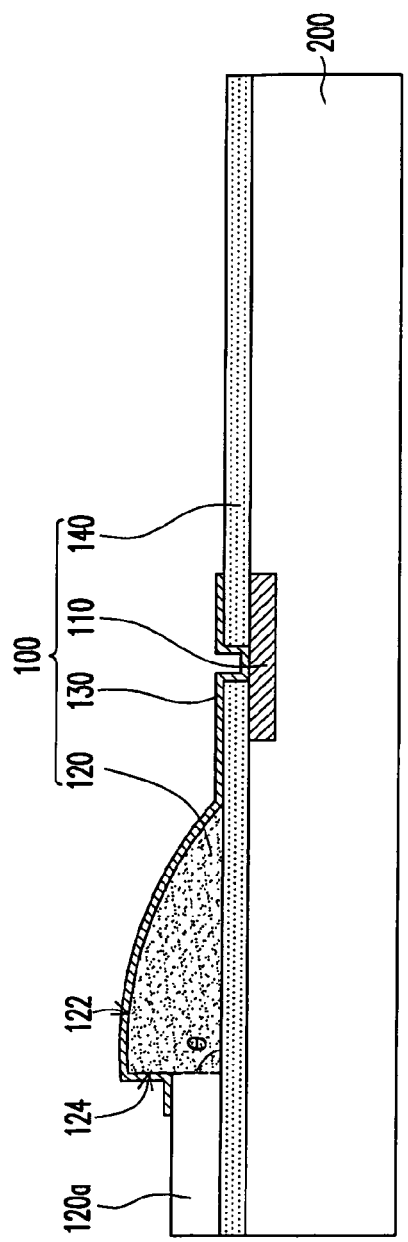
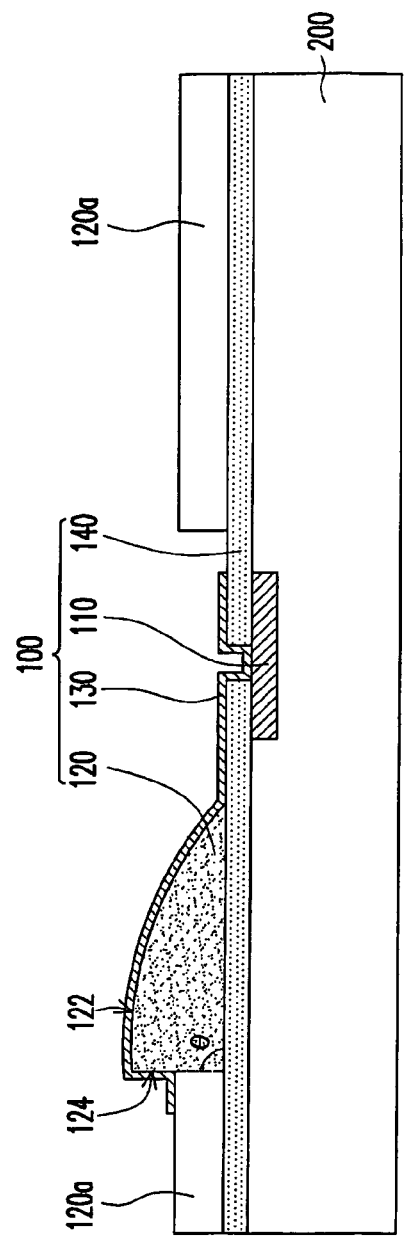
FIG. 64A
FIG. 64B

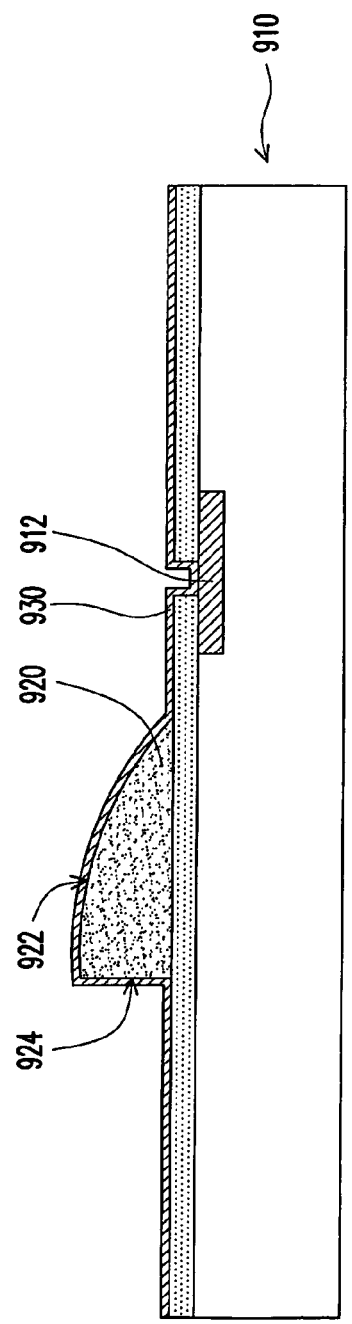
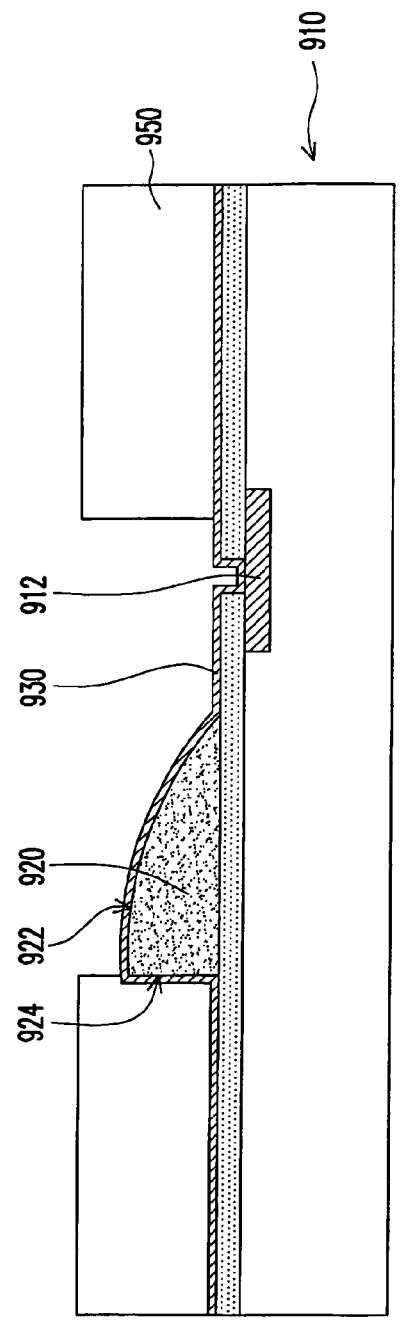
FIG. 65C
FIG. 65D

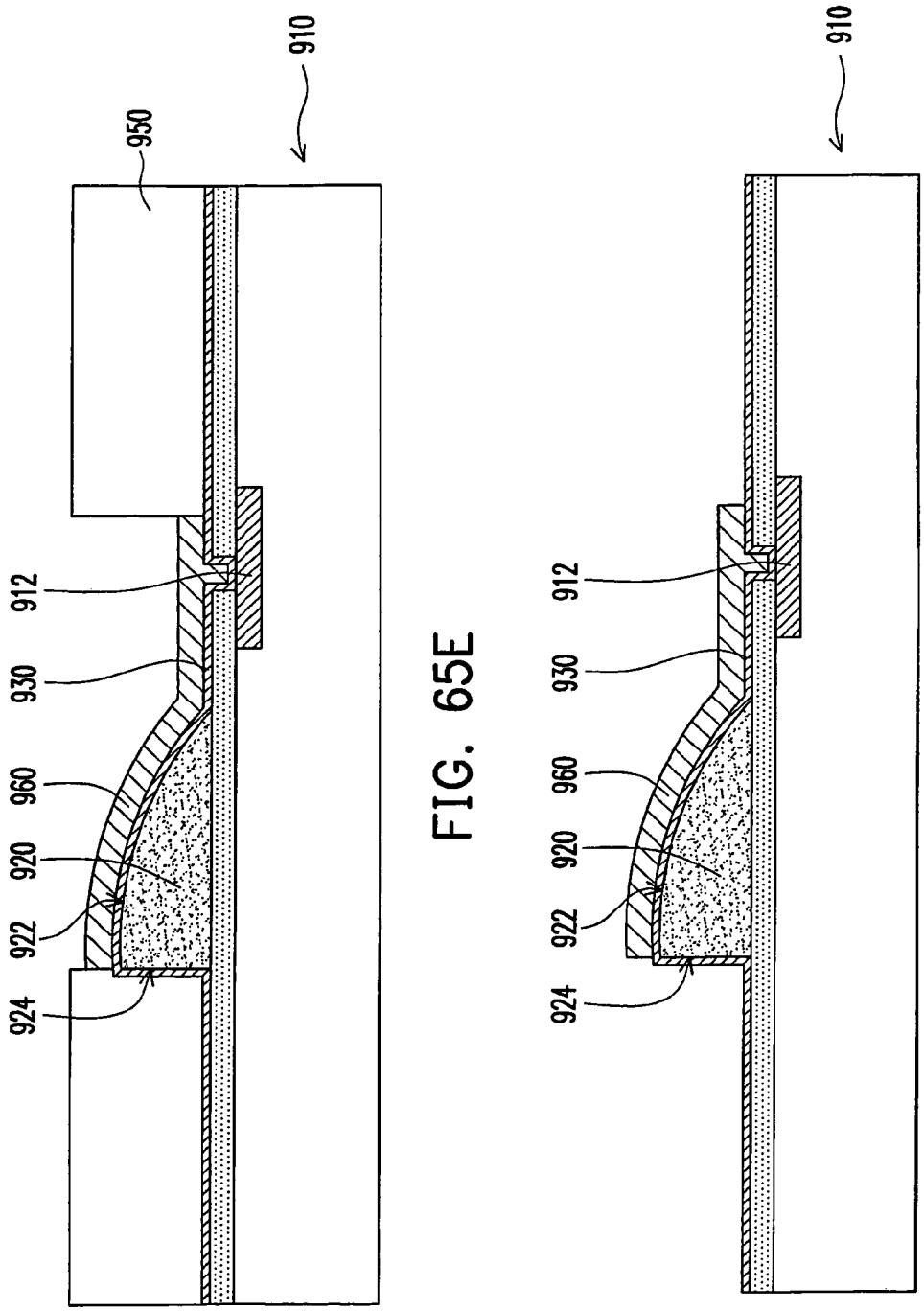

CONTACT STRUCTURE AND FORMING METHOD THEREOF AND CONNECTING STRUCTURE THEREOF

CROSS-REFERENCE TO RELATED APPLICATION

This application claims the priority benefit of Taiwan application serial no. 97111020, filed on Mar. 27, 2008. The entirety of the above-mentioned patent application is hereby incorporated by reference herein and made a part of specification.

BACKGROUND OF THE INVENTION

1. Field of the Invention

The present invention is related to a contact structure, a connecting structure thereof and a method of forming the same. In particular, the present invention is related to a contact structure, a method of forming the same and a connecting structure thereof, where a bonding material is easily penetrated through and stress concentration does not occur during bonding process.

2. Description of Related Art

As technology advances, all kinds of electronic devices are developed towards miniaturization and multiple functions. Hence, in order for chips in electronic device to be able to transmit or receive more signals, contacts electrically connected between chips and circuit boards are also developed towards high density.

In the prior art, a chip and a glass substrate are electrically connected mostly by disposing an anisotropic conductive film (ACF) between contacts of the chip and conductive structures of the glass substrate. The contacts of the chip and the conductive structures of the glass substrate both face the ACF. Afterwards, the contact of the chip, the ACF and the conductive structure of the glass substrate are laminated so that each of the contacts of the chip is electrically connected to the conductive structure corresponding to the contact on the glass substrate through conductive particles in the ACF.

However, as a density of the contacts on the chip and a density of the conductive structures of the glass substrate increase, a space between the contacts on the chip and a space between the conductive structures are both reduced. Therefore, it is likely that the contacts on the chip may be electrically connected with adjacent contacts or conductive structures through the conductive particles in the ACF, which in turn results in short circuit or electric leakage.

In view of the foregoing, a pillar-shaped polymer bump covered with a metal layer on its surface has been proposed as a contact structure of a chip. Further, a proposed method of electrically connecting the contact on the chip with the conductive structure of the glass substrate includes first disposing a non-conductive viscose layer between the chip and the conductive structure of the glass substrate. Thereafter, the chip is laminated on the glass substrate so that the pillar-shaped polymer bump penetrates through the non-conductive viscose, contacts the conductive structure of the glass substrate and electrically connects therewith.

However, the issue of stress concentration is prone to occur when the pillar-shaped polymer bump is laminated, which tends to make the metal layer crack and reduce the electrical reliability thereof.

SUMMARY OF THE INVENTION

The present invention is directed to a contact structure. The contact structure has a polymer bump which prevents stress concentration and easily penetrates through a bonding material between substrates.

The present invention is further directed to a connecting structure having better electrical reliability.

The present invention is also directed to a method of forming a contact structure. A polymer bump in the contact structure formed by the method has a curve surface and a steep surface.

In order to specifically describe the present invention, a contact structure disposed on a substrate is provided. The contact structure includes at least one pad, at least one polymer bump and at least one conductive layer. The pad is disposed on the substrate. The polymer bump is disposed on the substrate and has a curve surface and a steep surface connected therewith. An included angle between the steep surface and the substrate is from 30 to 150 degrees. The conductive layer covers the polymer bump and electrically connects the pad.

In order to specifically describe the present invention, a contact structure disposed on a substrate is provided. The contact structure includes at least one pad, at least one polymer bump and at least one conductive layer. The pad is disposed on the substrate. The polymer bump is disposed on the substrate and has a curve surface, a top plane connected with the curve surface and a steep surface connected with the top plane. An included angle between the steep surface and the substrate is from 30 to 150 degrees. The conductive layer covers the polymer bump and electrically connects the pad.

In order to specifically describe the present invention, a connecting structure including a first substrate, a second substrate and a bonding material is provided. The first substrate includes at least one pad, at least one polymer bump and at least one conductive layer. The polymer bump is disposed corresponding to the pad and has a curve surface and a steep surface connected therewith. An included angle between the steep surface and the substrate is from 30 to 150 degrees. The conductive layer covers the polymer bump and electrically connects the pad. The second substrate includes at least one conductive structure disposed thereon. The conductive layer on the first substrate is electrically connected with the conductive structure. The bonding material is disposed between the first substrate and the second substrate. A portion of the conductive layer and the polymer bump penetrate through the bonding material so as to contact the conductive structure.

In order to specifically describe the present invention, a connecting structure including a first substrate, a second substrate and a bonding material is provided. The first substrate includes at least one pad, at least one polymer bump and at least one conductive layer. The polymer bump is disposed corresponding to the pad and has a curve surface, a top plane connected with the curve surface and a steep surface connected with the top plane. An included angle between the steep surface and the substrate is from 30 to 150 degrees. The conductive layer covers the polymer bump and electrically connects the pad. The second substrate includes at least one conductive structure disposed thereon. The conductive layer on the first substrate is electrically connected with the conductive structure. The bonding material is disposed between the first substrate and the second substrate. A portion of the conductive layer and the polymer bump penetrate through the bonding material so as to contact the conductive structure.

In order to specifically describe the present invention, a method of forming a contact structure is provided in the following. First, a substrate is provided, and at least one pad has already been formed thereon. Afterwards, at least one polymer bump is formed on the substrate and has a curve surface and a steep surface connected therewith. An included angle between the steep surface and the substrate is from 30 to 150 degrees. Then, a conductive layer is formed on the substrate and the conductive layer covers the polymer bump and contacts with the pad.

In order to specifically describe the present invention, a method of forming a contact structure is provided as follows. First, a substrate is provided, and at least one pad has already been formed thereon. Next, at least one polymer bump is formed on the substrate and the polymer bump has a curve surface. Afterwards, at least one conductive layer is formed on the substrate and the conductive layer covers a portion of the polymer bump. Thereafter, the conductive layer is used as a mask to remove the polymer bump not covered by the conductive layer so as to form a steep surface. An included angle between the steep surface and the substrate is from 30 to 150 degrees.

According to the foregoing, the polymer bump of the present invention has a curve surface and a steep surface. Therefore, when the polymer bump contacts with another substrate, the curve surface of the polymer bump prevents an issue of stress concentration and the steep surface of the polymer bump facilitates penetration through the bonding material between the substrate and the another substrate by the polymer bump.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view of a contact structure according to an embodiment of the present invention.

FIGS. 2-12 are cross-sectional views illustrating variations in a contact structure according to embodiments of the present invention.

FIGS. 13-24 are cross-sectional views of the contact structure according to the second embodiment of the present invention.

FIGS. 25-36 are cross-sectional views of the contact structure according to the third embodiment of the present invention.

FIG. 37A is a top view of a contact structure according to an embodiment of the present invention. FIG. 37B is a cross-sectional view of the contact structure of FIG. 37A along lines I-I'. FIG. 37C is a cross-sectional view of the contact structure of 37A along lines II-II'.

FIG. 38A is a top view of a contact structure according to another embodiment of the present invention. FIG. 38B is a cross-sectional view of the contact structure of FIG. 38A along lines I-I'. FIG. 38C is a cross-sectional view of the contact structure of 38A along lines II-II'.

FIGS. 40-51 are cross-sectional views illustrating variations in the contact structure according to the fourth embodiment of the present invention.

FIG. 54 is a cross-sectional view of a contact structure according to another embodiment of the present invention.

FIG. 55 is a cross-sectional view of a contact structure according to another embodiment of the present invention.

FIGS. 62A through 62C are schematic cross-sectional views illustrating a method of forming a contact structure according to an embodiment of the present invention.

FIGS. 63A through 63D are schematic cross-sectional views illustrating a method of forming a contact structure according to another embodiment of the present invention.

FIGS. 64A and 64B are schematic cross-sectional views of a contact structure according to another embodiment of the present invention.

FIGS. 65A through 65G are schematic cross-sectional views illustrating a method of forming a contact structure according to an embodiment of the present invention.

DESCRIPTION OF EMBODIMENTS

Contact Structure

The First Embodiment

Figure 7:
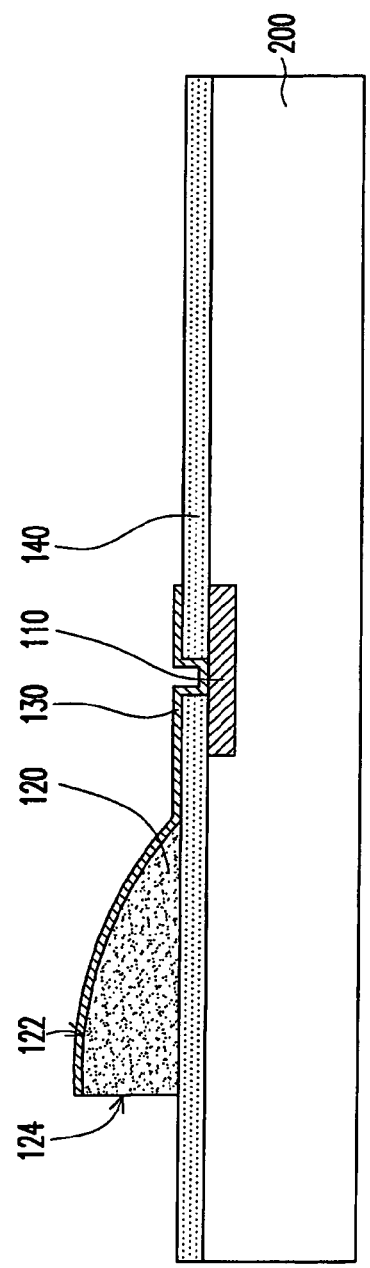
Figure 8:
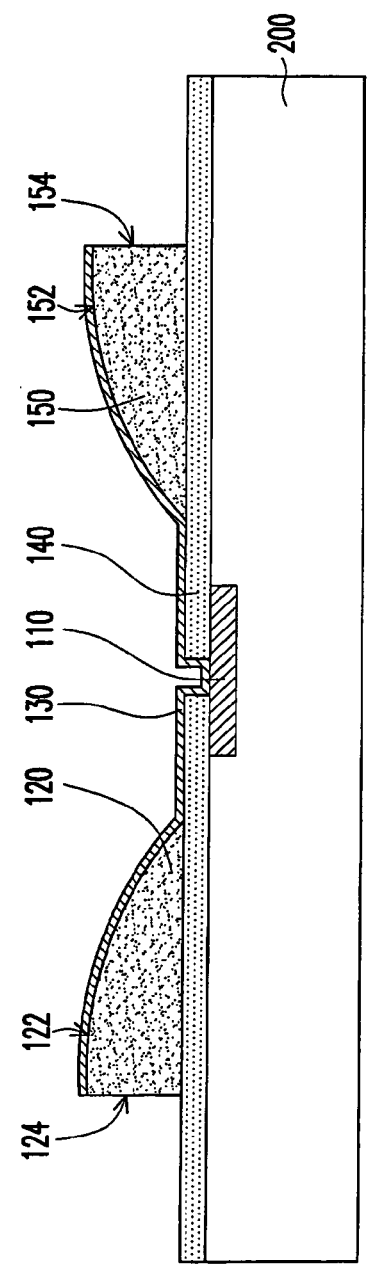
Figure 11:
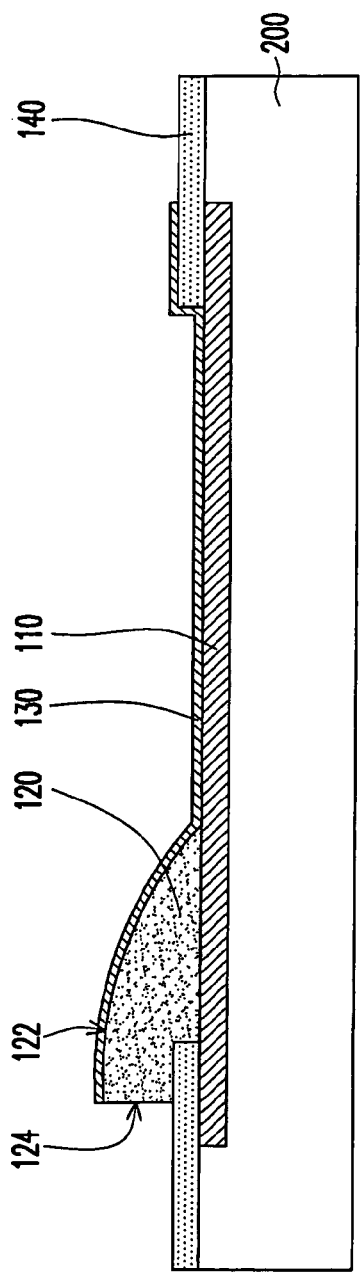
Figure 12:
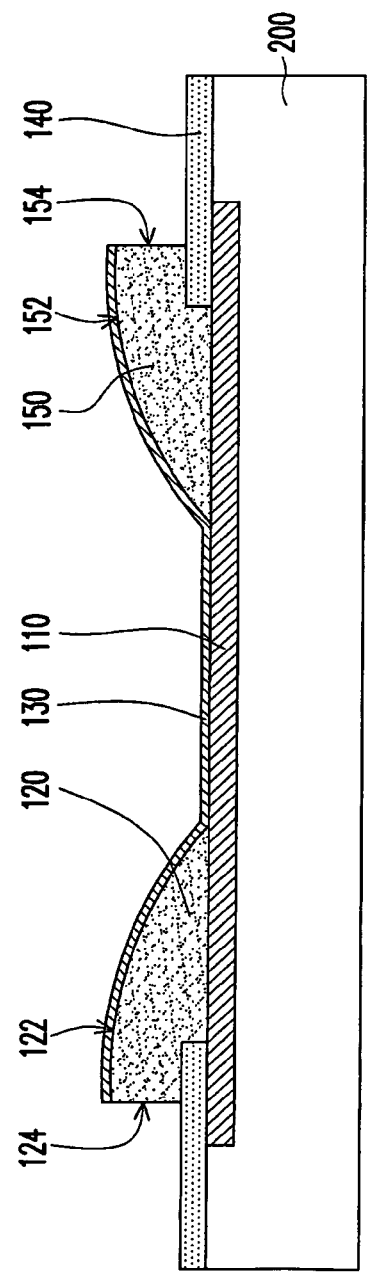
Figure 13:
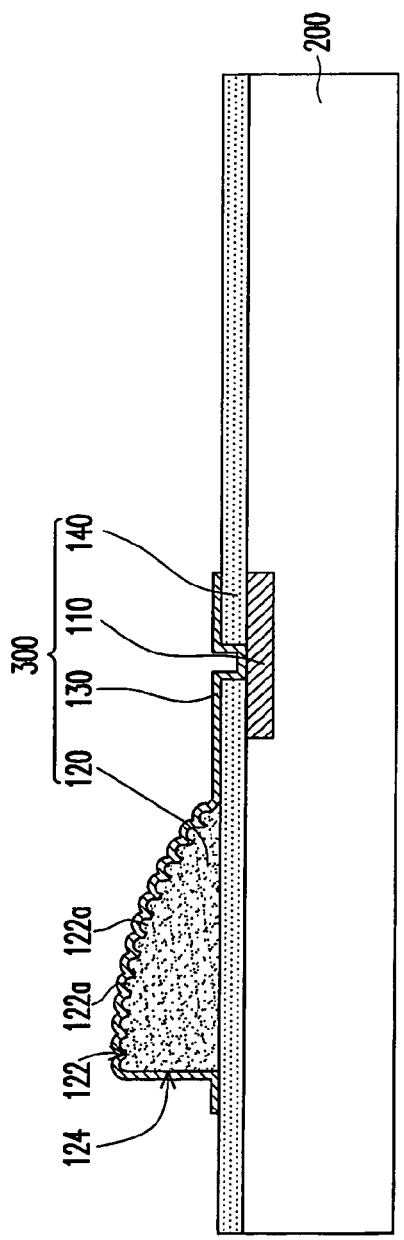
Figure 14:
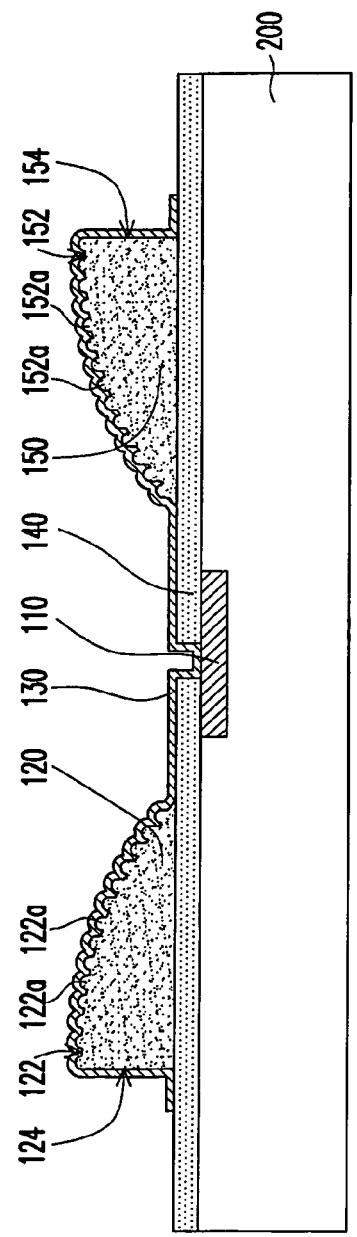
Figure 15:
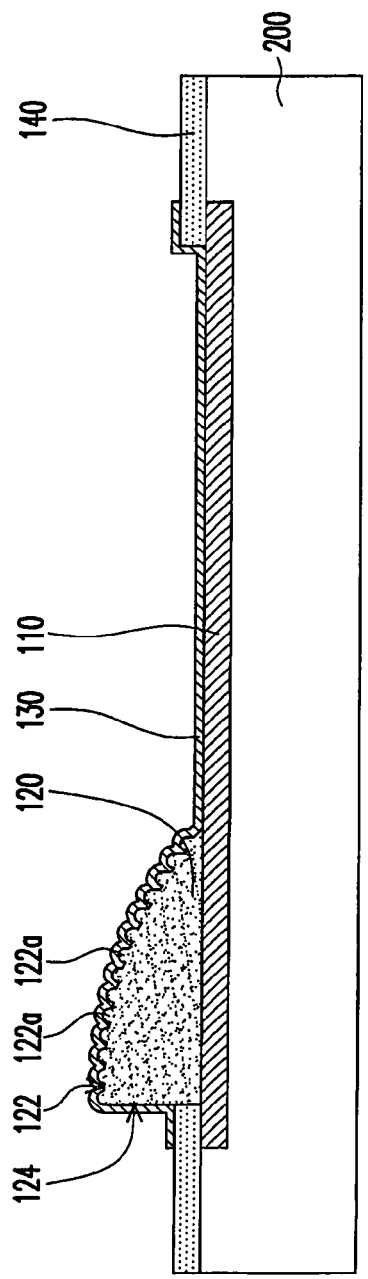
Figure 16:
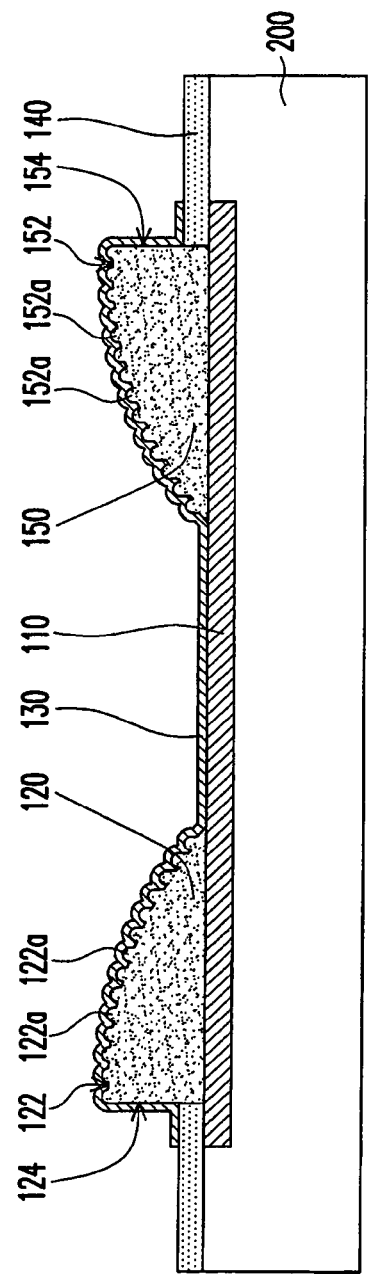
Figure 19:
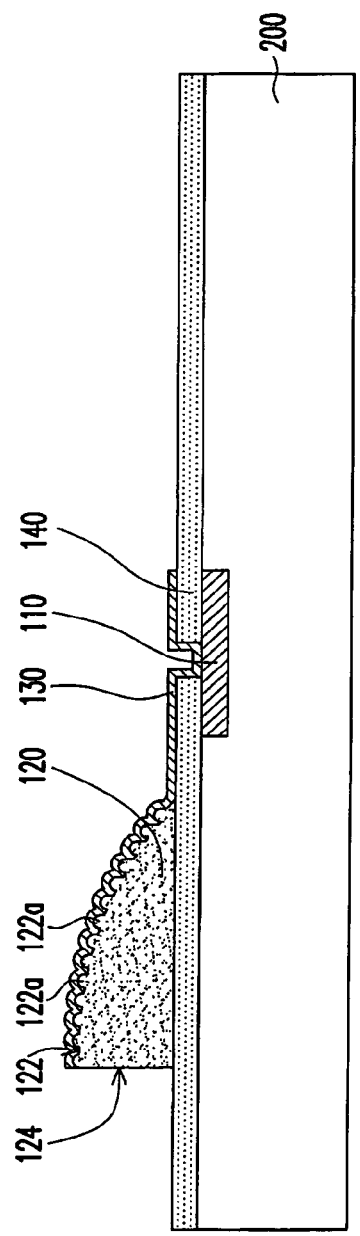
Figure 20:
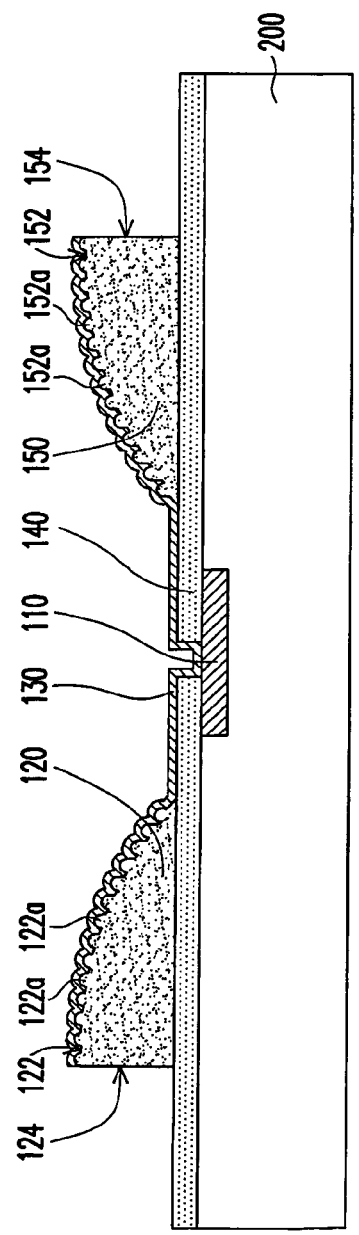
Figure 21:
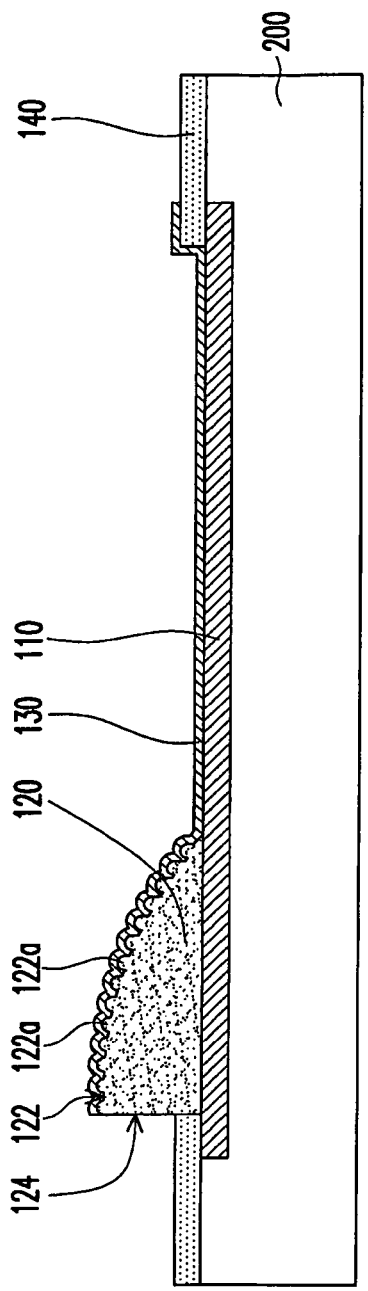
Figure 22:
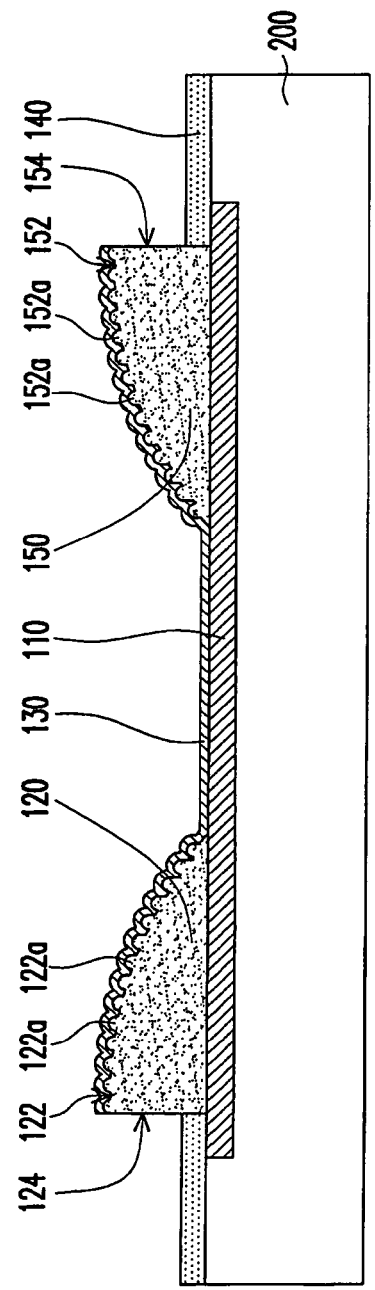
Figure 29:
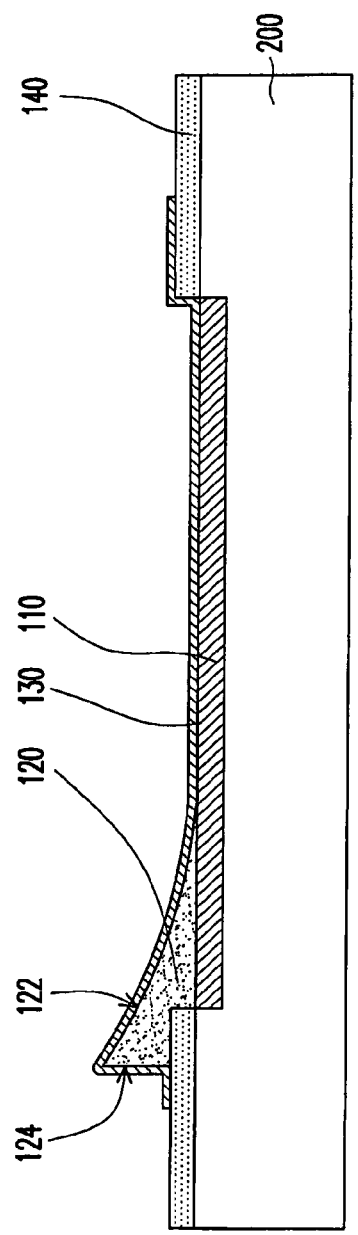
Figure 30:
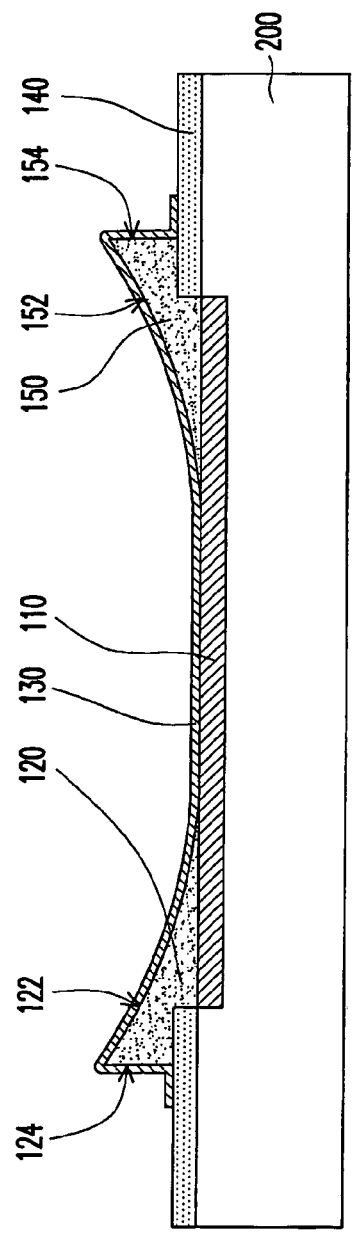
Figure 33:
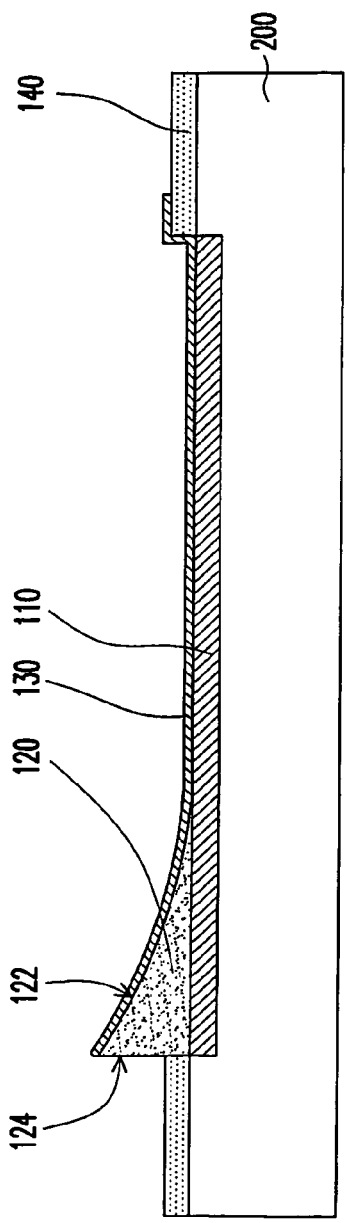
Figure 34:
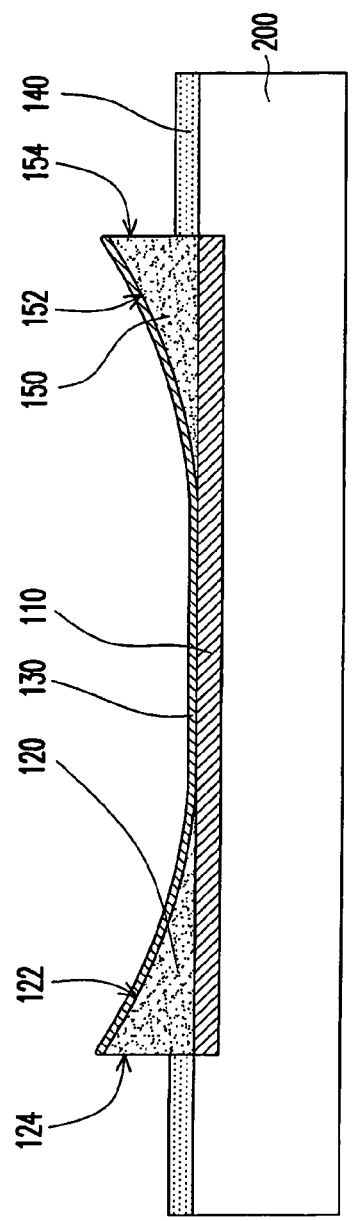

FIG. 1 is a schematic cross-sectional view of a contact structure according to an embodiment of the present invention. Referring to FIG. 1, a contact structure 100 of the present embodiment is disposed on a substrate 200. The contact structure 100 includes a pad 110, a polymer bump 120 and a conductive layer 130. The pad 110 is disposed on the substrate 200. The polymer bump 120 is disposed on the substrate 200 and has a curve surface 122 and a steep surface 124 connected therewith. An included angle θ between the steep surface 124 and the substrate 200 is from 30 to 150 degrees. The conductive layer 130 covers the polymer bump 120 and electrically connects the pad 110.

The polymer bump 120 of the present embodiment has the curve surface 122 and the steep surface 124 connected therewith. The steep surface 124 of the polymer bump 120 is substantially perpendicular to a surface of the substrate 200. Hence, when a bonding material is disposed between the substrate 200 and another substrate and the polymer bump 120 is desired to contact the another substrate, the polymer bump 120 having the steep surface 124 can easily penetrate through the bonding material so as to contact the another substrate. Moreover, since the polymer bump 120 has the curve surface 122, when the polymer bump 120 contacts with the another substrate, stress concentration does not occur. The polymer bump 120 reduces a force required for the substrate 200, the bonding material and another substrate to be laminated so that the polymer bump 120 penetrates through the bonding material. Further, a bounce force generated by contact between the polymer bump 120 and the another substrate is smaller.

In brief, the spirit of the present invention lies in that the polymer bump of the present invention has a curve surface and a steep surface connected therewith. When the polymer bump contacts another substrate, the curve surface of the polymer bump prevents stress concentration and the steep surface of the polymer bump facilitates penetration through the bonding material between the substrate and the another substrate by the polymer bump. People having skill in the art can make various alterations and modifications without departing from the spirit and scope of the present invention.

Furthermore, referring to FIG. 1 again, in the present embodiment, the contact structure 100 further includes a passivation layer 140. The passivation layer 140 is disposed on the substrate 200 and exposes the pad 110. Moreover, in the present embodiment, the curve surface 122 of the polymer bump 120 protrudes, for example, in a direction away from the substrate 200.

In the present invention, a plurality of variations may still exist between the polymer bump 120 and the conductive layer 130. Variations in the contact structure 100 of FIG. 1 are described below.

A contact structure of FIG. 2 further includes a polymer bump 150 disposed on the substrate 200 besides the polymer bump 120, the pad 110 and the conductive layer 130 as illustrated in FIG. 1. The pad 110 is disposed between the polymer bump 150 and the polymer bump 120, and the conductive layer 130 further covers the polymer bump 150. The polymer bump 150 has a curve surface 152 and a steep surface 154 connected therewith. An included angle θ between the steep surface 154 and the substrate 200 is from 30 to 150 degrees.

Neither of the polymer bumps 120 in FIGS. 1 and 2 directly covers the pad 110. However, in the present invention, the polymer bump 120 may also be disposed on the pad 110. As illustrated in FIG. 3, the polymer bump 120 is disposed on the pad 110 and exposes a portion of the pad 110 so that the conductive layer 130 of the polymer bump 120 can be electrically connected to the exposed pad 110. Likewise, as illustrated in FIG. 4, the polymer bumps 120 and 150 are both disposed on the pad 110 and expose a portion of the pad 110 respectively so that the conductive layer 130 of the polymer bumps 120 and 150 can be electrically connected to the exposed pad 110.

Moreover, in the present invention, the polymer bump 120 may also not cover the pad 110 or be located outside the pad 110, or only a portion of the polymer bump 120 is disposed on the pad 110 and the other portion of the polymer bump 120 is disposed on the substrate 200. As illustrated in FIG. 5, a portion of the polymer bump 120 is disposed on the pad 110 and the other portion of the polymer bump 120 is disposed on the substrate 200 or the passivation layer 140 and exposes a portion of the pad 110. As a result, the conductive layer 130 of the polymer bump 120 is electrically connected to the exposed pad 110. Similarly, as illustrated in FIG. 6, each of the polymer bumps 120 and 150 has a portion disposed on the pad 110 and the other portion disposed on the substrate 200 or the passivation layer 140 and exposes a portion of the pad 110. As a result, the conductive layer 130 of the polymer bump 120 is electrically connected to the exposed pad 110.

In all the embodiments as illustrated in FIGS. 1-6, the conductive layer 130 wholly covers the polymer bump 120. However, actually in the present invention, the conductive layer 130 may also cover only a portion of the polymer bump 120 as described in the following.

Embodiments illustrated by FIGS. 7-12 are respectively similar to embodiments illustrated by FIGS. 1-6 in order. Difference lies in that in the embodiments of FIGS. 7-12, the conductive layer 130 partially covers the polymer bump 120 or partially covers the polymer bumps 120 and 150.

The Second Embodiment

FIGS. 13-24 are schematic cross-sectional views of the contact structure according to the second embodiment of the present invention. Each second embodiment illustrated by FIGS. 13-24 is respectively similar to those illustrated by FIGS. 1-12 in order. Difference lies in that in the embodiments of FIGS. 13-24, the curve surface 122 of the polymer bump 120 in a contact structure 300 further includes a plurality of concave-convex structures 122a thereon, or besides which, a curve surface 152 of the polymer bump 150 in the contact structure 300 also includes a plurality of concave-convex structures 152a thereon.

Hence, when a bonding material is disposed between the substrate 200 and another substrate and the polymer bump 120 is desired to contact the another substrate, the concave-convex structures 122a help the polymer bump 120 penetrate through the bonding material so as to contact the another substrate. Or, when a bonding material is disposed between the substrate 200 and another substrate and the polymer bumps 120 and 150 are desired to contact the another substrate, the concave-convex structures 122a and 152a help the polymer bumps 120 and 150 penetrate through the bonding material so as to contact the another substrate.

The Third Embodiment

FIGS. 25-36 are schematic cross-sectional views of the contact structure according to the third embodiment of the present invention. Each third embodiment illustrated by FIGS. 25-36 is respectively similar to those illustrated by FIGS. 1-12 in order. Difference lies in that in the embodiments of FIGS. 25-36, the curve surface 122 of the polymer bump 120 in a contact structure 400 concaves toward the substrate 200, or besides which, the curve surface 152 of the polymer bump 150 in the contact structure 400 also concaves toward the substrate 200. Therefore, in the embodiments illustrated by FIGS. 25-36, a junction between the curve surface 122 and a perpendicular surface 124 of the polymer bump 120 is a sharp structure. The junction between the curve surface 152 and the perpendicular surface 154 of the polymer bump 150 is a sharp structure.

Hence, when a bonding material is disposed between the substrate 200 and another substrate and the polymer bump 120 is desired to contact the another substrate, the curve surface 122 helps the polymer bump 120 penetrate through the bonding material so as to contact the another substrate without causing stress concentration. Or, when a bonding material is disposed between the substrate 200 and another substrate and the polymer bumps 120 and 150 are desired to contact the another substrate, the curve surfaces 122 and 152 help the polymer bumps 120 and 150 penetrate through the bonding material so as to contact the another substrate without causing stress concentration.

Additionally, in each of the foregoing embodiments, the polymer bump may be a block structure or a strip structure.

FIGS. 37A through 37C illustrate embodiments where the polymer bump is a block structure. Particularly, disposition of the polymer bump in FIG. 1 is taken as an example in FIGS. 37A through 37C. Although not every block structure of the polymer bumps in the embodiments of FIGS. 2-36 is illustrated herein, people having skill in the art should be able to understand the block structures of the polymer bumps of FIGS. 2-36 according to the description of FIGS. 37A through 37C.

FIG. 37A is a top view of a contact structure according to an embodiment of the present invention. FIG. 37B is a cross-sectional view of the contact structure of FIG. 37A along lines I-I'. FIG. 37C is a cross-sectional view of the contact structure of FIG. 37A along lines II-II'. Referring to FIGS. 37A through 37C simultaneously, the polymer bump 120 therein is a block structure. Since the polymer bump 120 is a block structure, a conductive layer 130 correspondingly covers each block structure of the polymer bump 120.

FIGS. 38A through 38C illustrate embodiments where the polymer bump is a strip structure. Particularly, disposition of the polymer bump in FIG. 1 is taken as an example in FIGS. 38A through 38C. Although not every strip structure of the polymer bumps in the embodiments of FIGS. 2-36 is illustrated, people having skill in the art should be able to understand the strip structures of the polymer bumps of FIGS. 2-36 according to the description of FIGS. 38A through 38C.

FIG. 38A is a top view of a contact structure according to another embodiment of the present invention. FIG. 38B is a cross-sectional view of the contact structure of FIG. 38A along lines I-I'. FIG. 38C is a cross-sectional view of the contact structure of FIG. 38A along lines II-II'. Referring to both FIGS. 38A through 38C simultaneously, when the polymer bump 120 is a strip structure, a plurality of conductive layers 130 covers the same strip of the polymer bump 120 and each of the conductive layers 130 is electrically connected to the pad 110 correspondingly. In the other embodiments, a plurality of conductive layers may also cover the same strip of polymer bump and the conductive layers are all electrically connected to the same pad.

The Fourth Embodiment

Figure 39:
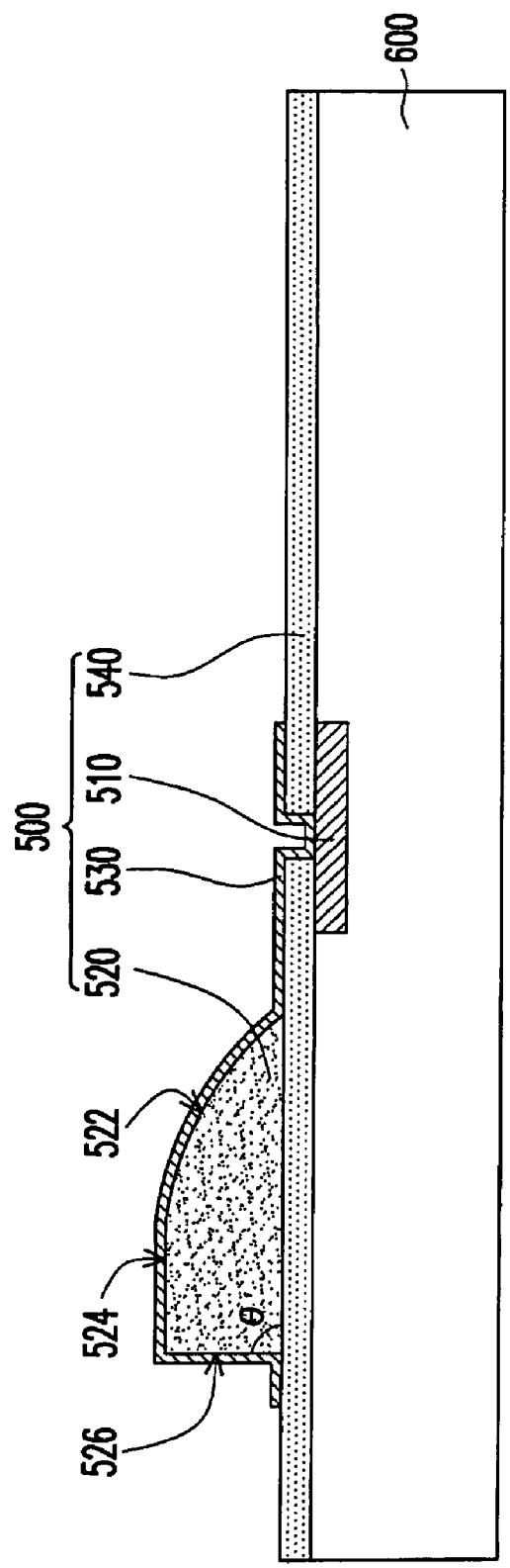
FIG. 39 is a cross-sectional view of the contact structure according to the fourth embodiment of the present invention.

FIG. 39 is a schematic cross-sectional view of the contact structure according to the fourth embodiment of the present invention. Referring to FIG. 39, a contact structure 500 of the present embodiment is disposed on a substrate 600. The contact structure 500 includes a pad 510, a polymer bump 520 and a conductive layer 530. The pad 510 is disposed on the substrate 600. The polymer bump 520 is disposed on the substrate 600 and has a curve surface 522 and a top plane 524 connected with the curve surface 522 and a steep surface 526 connected with the top plane 524. An included angle θ between the steep surface 526 and the substrate 600 is from 30 to 150 degrees. In the present embodiment, the top plane 524 is a smooth structure. The conductive layer 530 covers the polymer bump 520 and electrically connects the pad 510.

In view of the foregoing, the polymer bump 520 of the present embodiment has the curve surface 522, the top plane 524 connected with the curve surface 522 and the steep surface 526 connected with the top plane 524. The steep surface 526 of the polymer bump 520 is substantially perpendicular to a surface of the substrate 600. Therefore, when a bonding material is disposed between the substrate 600 and another substrate and the polymer bump 520 is desired to contact the another substrate, the polymer bump 520 having the steep surface 526 can easily penetrate through the bonding material so as to contact the another substrate. Moreover, since the polymer bump 520 has the curve surface 522, when the polymer bump 520 contacts another substrate, stress concentration does not occur.

In addition, since the polymer bump 520 has the top plane 524, when the polymer bump 520 contacts another substrate, a contact area between the polymer bump 520 and the another substrate is larger. Further, the polymer bump 520 reduces a force required for the substrate 600, the bonding material and another substrate to be laminated so that the polymer bump 520 penetrates through the bonding material. A bounce force generated by contact between the polymer bump 520 and the another substrate is also smaller.

In brief, the spirit of the present invention lies in that the polymer bump of the present invention has a curve surface, a top plane and a steep surface. When the polymer bump contacts another substrate, the steep surface of the polymer bump facilitates penetration through a bonding material between the substrate and the another substrate by the polymer bump. The top plane increases a contact area between the polymer bump and the another substrate and the curve surface of the polymer bump avoids causing stress concentration. People having skill in the art can make various alterations and modifications without departing from the spirit and scope of the present invention.

Furthermore, referring to FIG. 39 again, in the present embodiment, the contact structure 500 further includes a passivation layer 540. The passivation layer 540 is disposed on the substrate 600 and exposes the pad 510. Further, the curve surface 522 of the polymer bump 520 may also include a plurality of concave-convex structures 522a (as illustrated in FIG. 40) thereon.

In the present invention, a plurality of variations may still exist between the polymer bump 520 and the conductive layer 530. The contact structures 500 in FIGS. 39 and 40 may have a plurality of variations and some variations in the contact structure 500 of FIG. 40 are described as follows.

Figure 40:
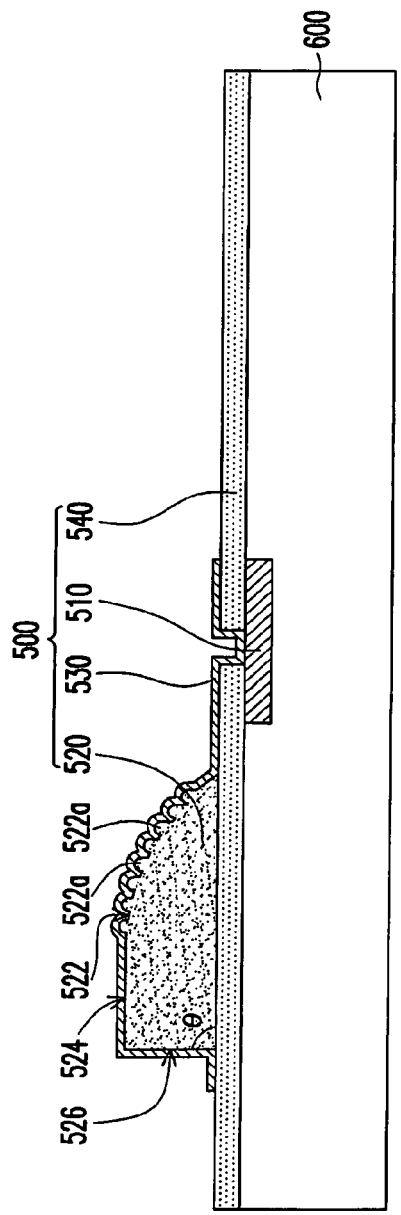
Figure 41:
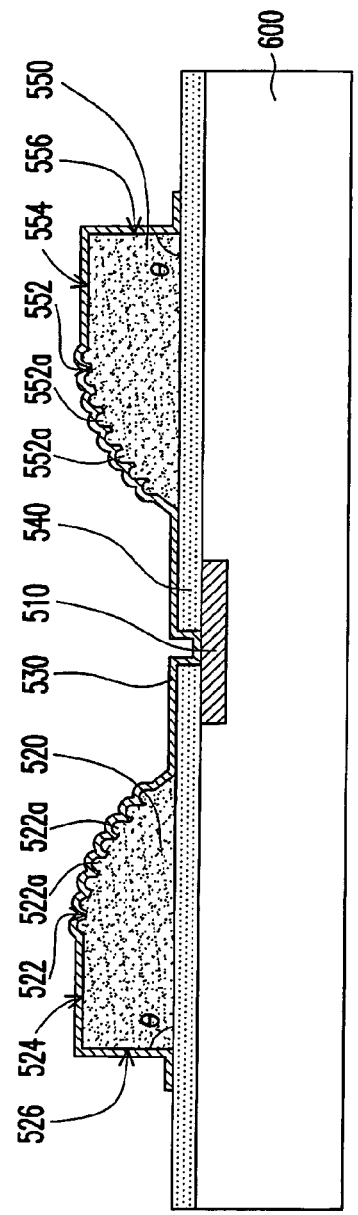

The contact structure of FIG. 41 further includes a polymer bump 550 disposed on the substrate 600 besides the polymer bump 520, the pad 510 and the conductive layer 530 as illustrated in FIG. 40. The pad 510 is disposed between the polymer bump 550 and the polymer bump 520, and the conductive layer 530 further covers the polymer bump 550. The polymer bump 550 has a curve surface 552, a top plane 554 connected with the curve surface 552 and a steep surface 556 connected with the top plane 554. An included angle θ between the steep surface 556 and the substrate 600 is from 30 to 150 degrees. Additionally, in the present embodiment, the curve surface 552 may include a plurality of concave-convex structures 552a thereon. Therefore, when the polymer bumps 520 and 550 contact another substrate, the concave-convex structures 522a and 552a facilitate penetration through the bonding material between the substrate 600 and the another substrate by the polymer bumps 520 and 550.

Neither of the polymer bumps 520 in FIGS. 40 and 41 covers the pad 510. However, in the present invention, the polymer bump 520 may also be disposed on the pad 510. As illustrated in FIG. 42, the polymer bump 520 is disposed on the pad 510 and exposes a portion of the pad 510. As a result, the conductive layer 530 of the polymer bump 520 is electrically connected to the exposed pad 510. Likewise, as illustrated in FIG. 43, the polymer bumps 520 and 550 are both disposed on the pad 510 and expose a portion of the pad 510 respectively. As a result, the conductive layer 530 of the polymer bumps 520 and 550 can be electrically connected to the exposed pad 510.

Figure 44:
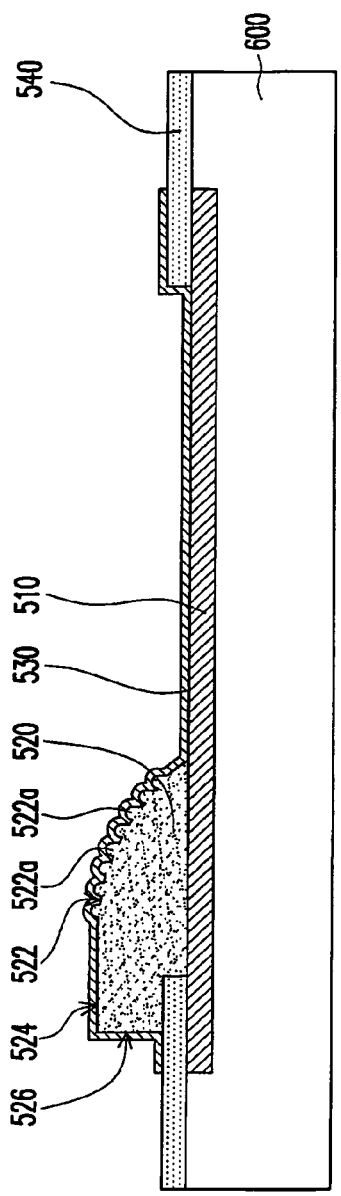
Figure 45:
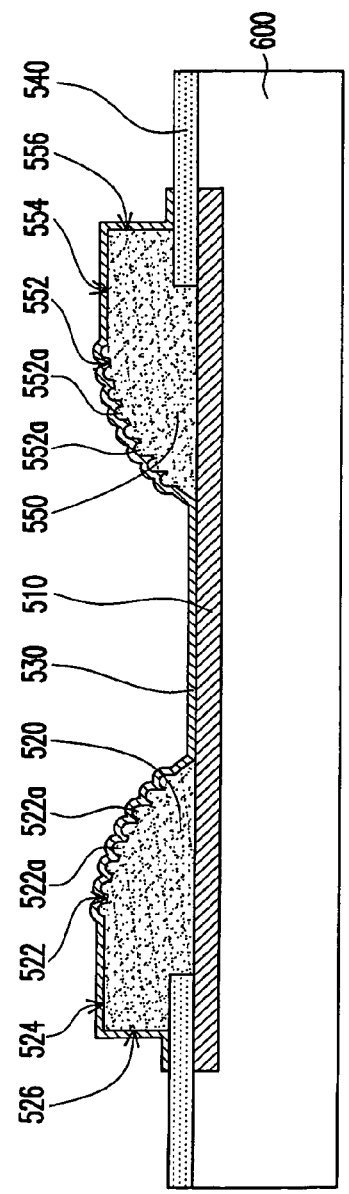
Figure 50:
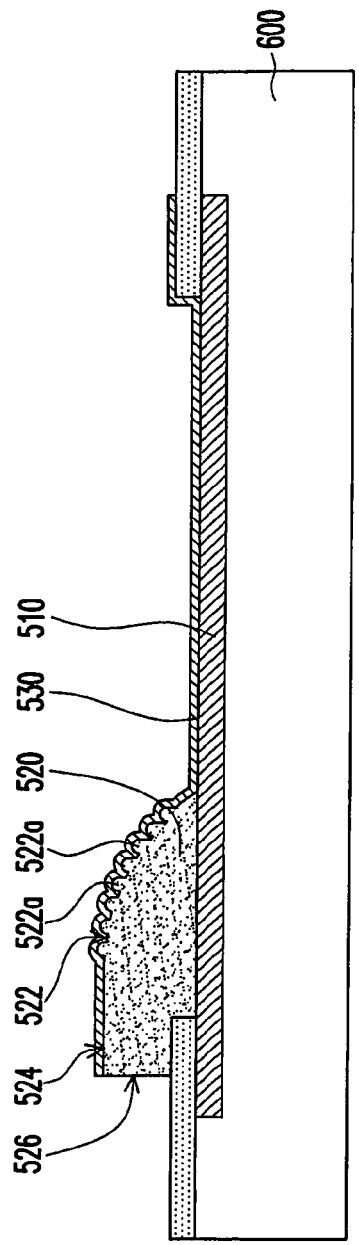
Figure 51:
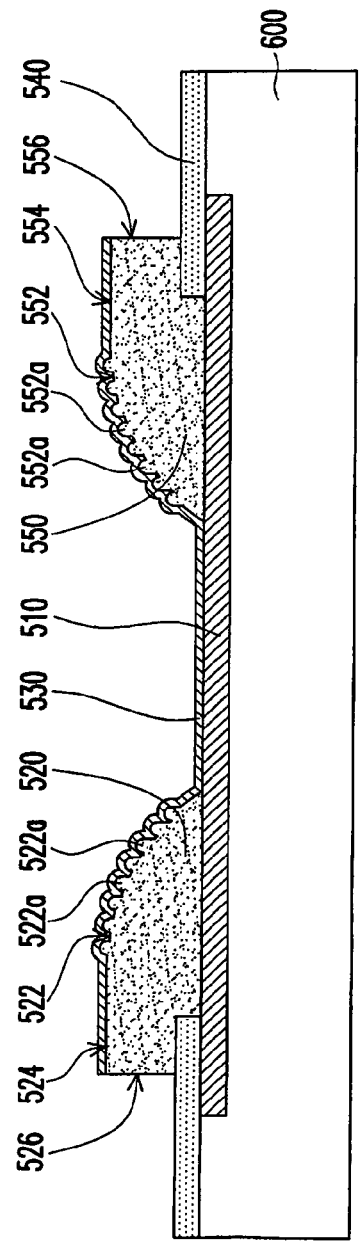

Moreover, in the present invention, the polymer bump 520 may also not cover the pad 510 or be disposed outside the pad 510, or only a portion of the polymer bump 520 is disposed on the pad 510 and the other portion of the polymer bump 520 is disposed on the substrate 600. As illustrated in FIG. 44, a portion of the polymer bump 520 is disposed on the pad 510 and the other portion of the polymer bump 520 is disposed on the substrate 600 or the passivation layer 540 and exposes a portion of the pad 510. As a result, the conductive layer 530 of the polymer bump 120 is electrically connected to the exposed pad 510. Similarly, as illustrated in FIG. 45, each of the polymer bumps 520 and 550 has a portion disposed on the pad 510 and the other portion disposed on the substrate 600 or the passivation layer 540 and exposes a portion of the pad 510. As a result, the conductive layer 530 of the polymer bump 520 is electrically connected to the exposed pad 510.

In all the embodiments illustrated by FIGS. 40-45, each of the conductive layers 530 wholly covers the polymer bump 520. However, actually in the present invention, the conductive layer 530 may also cover only a portion of the polymer bump 520 as described in the following.

Embodiments illustrated by FIGS. 46-51 are respectively similar to embodiments illustrated by FIGS. 40-45 in order. Difference lies in that in the embodiments of FIGS. 40-45, the conductive layer 530 partially covers the polymer bump 520 or partially covers the polymer bumps 520 and 550.

It should be noted that in the embodiments of FIGS. 41-51, the curve surface of the polymer bump including concave-convex structures thereon is taken as an example for explanation. Actually, in the embodiments illustrated by FIGS. 41-51, the curve surface 522 of the polymer bump 520 may not have concave-convex structures 552a or the curve surfaces 522 and 552 of the polymer bumps 520 and 550 may not have concave-convex structures 522a and 552a.

In addition, the polymer bump in each of the foregoing embodiments may be a block structure or a strip structure.

Figure 52B:
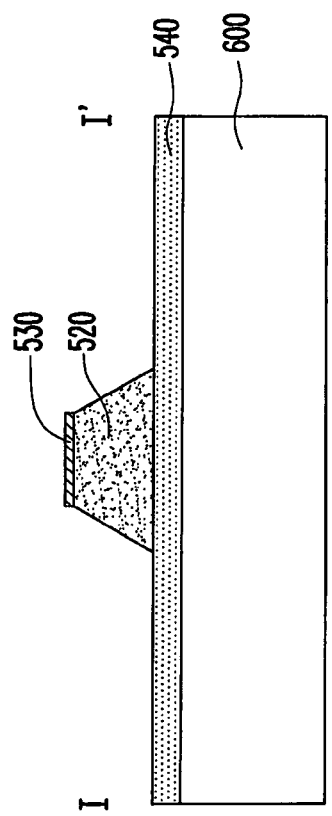
FIG. 52B is a cross-sectional view of the contact structure of FIG. 52A along lines I-I'.
Figure 52A:
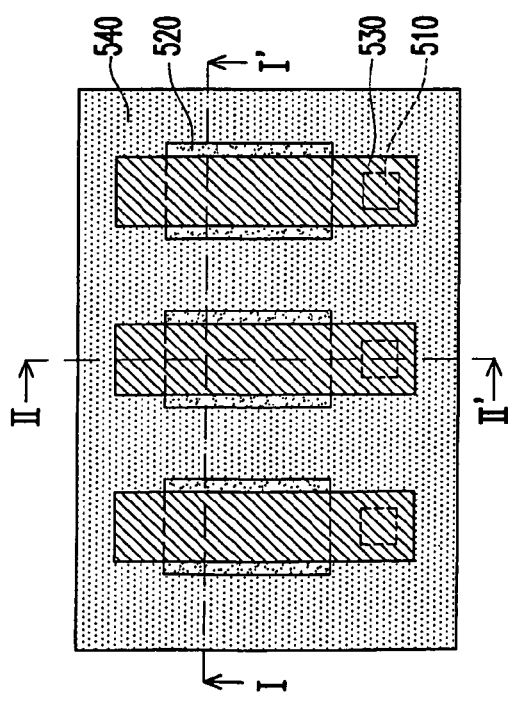
FIG. 52A is a top view of a contact structure according to an embodiment of the present invention.
Figure 52C:
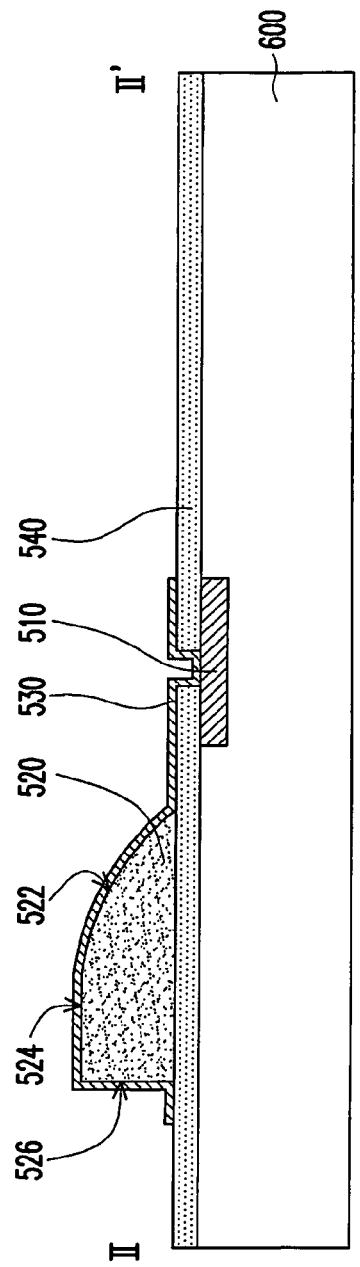
FIG. 52C is a cross-sectional view of the contact structure of 52A along lines II-II'.

FIGS. 52A through 52C illustrate embodiments where the polymer bump is a block structure. Particularly, disposition of the polymer bump in FIG. 39 is taken as an example for explanation of FIGS. 52A through 52C. Although not every block structure of the polymer bumps in the embodiments of FIGS. 40-51 is illustrated, people having skill in the art should be able to understand the block structures of the polymer bumps of FIGS. 40-51 according to the description of FIGS. 52A through 52C.

FIG. 52A is a top view of a contact structure according to an embodiment of the present invention. FIG. 52B is a cross-sectional view of the contact structure of FIG. 52A along lines I-I'. FIG. 52C is a cross-sectional view of the contact structure of 52A along lines II-II'. Referring to FIGS. 52A through 52C, the polymer bump 520 is a block structure. Since the polymer bump 520 is a block structure, a conductive layer 530 covers each block structure of the polymer bump 520 correspondingly.

Figure 53B:
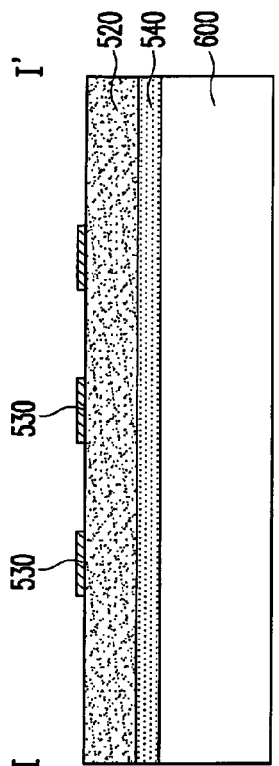
FIG. 53B is a cross-sectional view of the contact structure of FIG. 53A along lines I-I'.
Figure 53A:
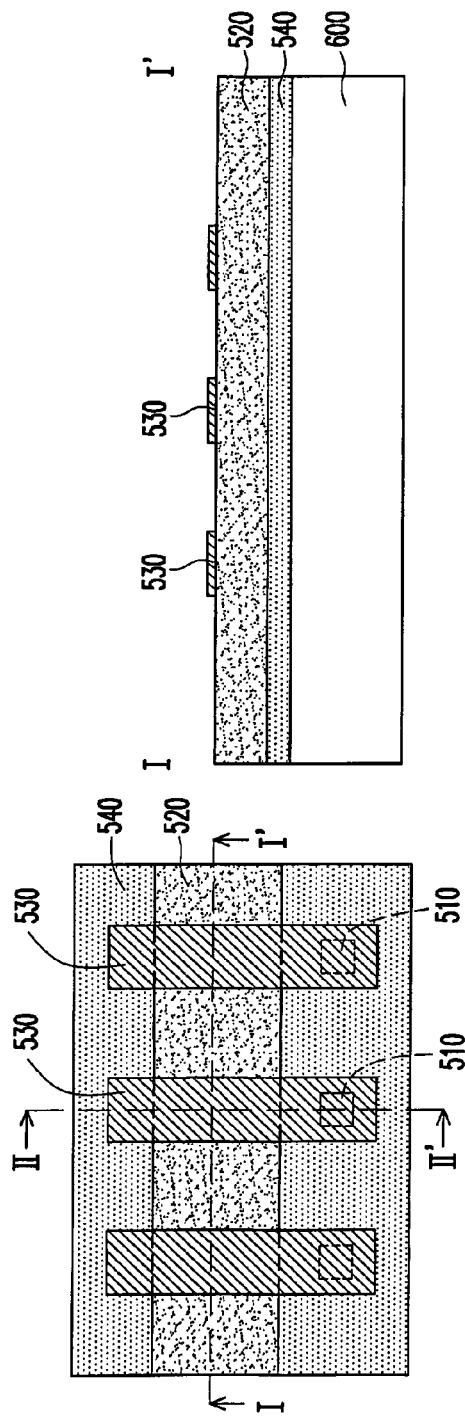
FIG. 53A is a top view of a contact structure according to another embodiment of the present invention.
Figure 53C:
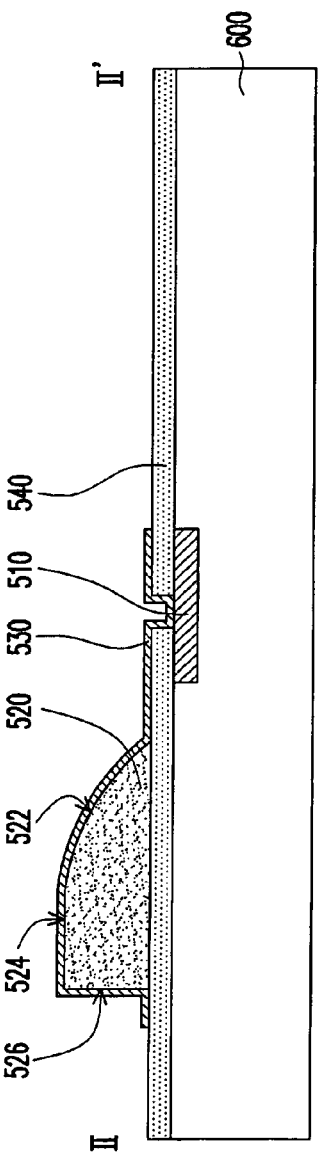
FIG. 53C is a cross-sectional view of the contact structure of 53A along lines II-II'.

FIGS. 53A through 53C illustrate embodiments where the polymer bump is a strip structure. Particularly, disposition of the polymer bump in FIG. 39 is taken as an example for explanation of FIGS. 53A through 53C. Although not every strip structure of the polymer bumps in the embodiments of FIGS. 40-51 is illustrated, people having skill in the art should be able to understand the strip structures of the polymer bumps of FIGS. 40-51 according to the description of FIGS. 53A through 53C.

FIG. 53A is a top view of a contact structure according to an embodiment of the present invention. FIG. 53B is a cross-sectional view of the contact structure of FIG. 53A along lines I-I'. FIG. 53C is a cross-sectional view of the contact structure of 53A along lines II-II'. Referring to FIGS. 53A through 53C, when the polymer bump 520 is a strip structure, a plurality of conductive layers 530 covers the same strip of the polymer bump 520 and each of the conductive layers 530 is electrically connected to the pad 510 correspondingly. In other embodiments, a plurality of conductive layers may also cover the same strip of the polymer bump and the conductive layers are all electrically connected to the same pad.

FIG. 54 is a cross-sectional view of a contact structure according to another embodiment of the present invention. Referring to both FIGS. 54 and 39, a contact structure of FIG. 54 is similar to the contact structure 500 in FIG. 39. Difference between the two contact structures lies in that a top plane 524 of the contact structure in FIG. 54 further includes a plurality of concave-convex structures 524a. The concave-convex structures 524a on the top plane 524 facilitate penetration through the bonding material (not illustrated) between the substrate 600 and another substrate (not illustrated) by the polymer bump 520. The contact structure in FIG. 54 may replace all of the contact structures in FIGS. 40-53.

FIG. 55 is a cross-sectional view of a contact structure according to another embodiment of the present invention. Referring to both FIGS. 55 and 40, a contact structure of FIG. 55 is similar to the contact structure 500 in FIG. 40. Difference between the two contact structures lies in that the top plane 524 of the contact structure in FIG. 55 further includes a plurality of concave-convex structures 524a. The concave-convex structures 524a on the top plane 524 facilitate penetration through the bonding material (not illustrated) between the substrate 600 and another substrate (not illustrated) by the polymer bump 520. The contact structure in FIG. 55 may replace all of the contact structures in FIGS. 41-53.

Connecting Structure

The foregoing contact structures disclosed in FIGS. 1-38 are laminated with another substrate to form a connecting structure. A method of connecting the connecting structure is described in detail below.

Figure 56:
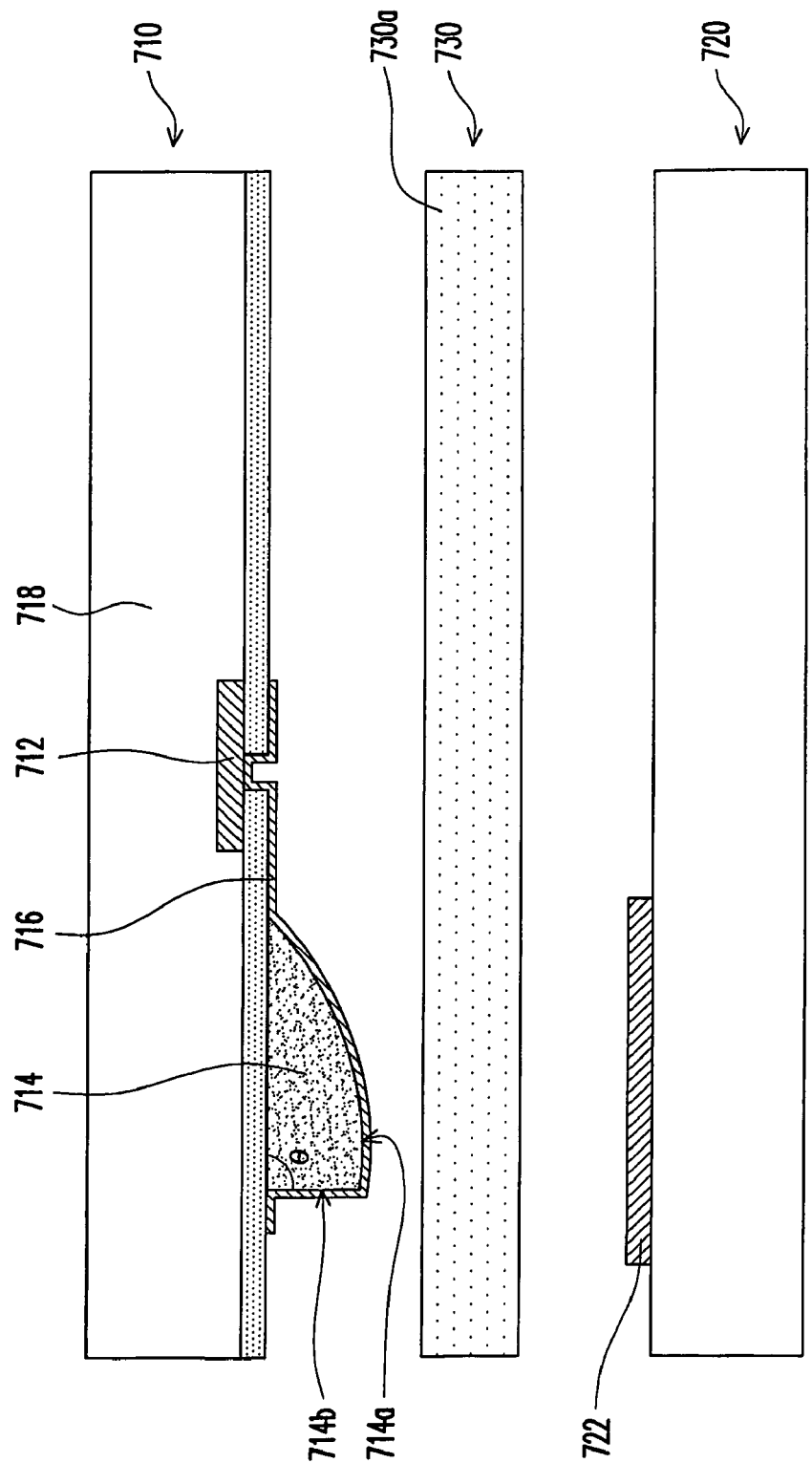
FIG. 56 is a cross-sectional view of a connecting structure before lamination according to an embodiment of the present invention.

Referring to FIG. 56, first, a first substrate 710 and a second substrate 720 are provided. The first substrate 710 includes at least one pad 712, at least one polymer bump 714 and at least one conductive layer 716. The polymer bump 714 is disposed corresponding to the pad 712 and has a curve surface 714a and a steep surface 714b connected therewith. An included angle θ between the steep surface 714b and the first substrate 710 is from 30 to 150 degrees. It should be noted that a contact structure on the first substrate 710 may be any of the contact structures as illustrated in FIGS. 1-38 and is not limited to the contact structure illustrated by FIG. 56. The conductive layer 716 covers the polymer bump 714 and electrically connects the pad 712. Further, at least one conductive structure 722 is disposed on the second substrate 720.

Afterwards, a bonding material 730 is disposed between the first substrate 710 and the second substrate 720. Both a side having the polymer bump 714 of the first substrate 710 and a side having the conductive structure 722 of the second substrate 720 face the bonding material 730. The bonding material 730 may be an ultraviolet-cured bonding material, a thermo-cured bonding material, a thermoplastic bonding material or any combination of the aforementioned. In other words, the bonding material 730 may be a bonding material cured by ultraviolet (UV) light, a thermal curing process, a microwave curing process, an ultrasonic curing process or any combination of the foregoing curing methods. Further, the bonding material 730 includes a non-conductive paste (NCP), a non-conductive film (NCF), an anisotropic conductive paste or an anisotropic conductive film. Moreover, in the present embodiment, the bonding material 730 further includes filling particles 730a distributed therein. The said filling particles 730a include conductive particles or insulating particles.

Figure 57:
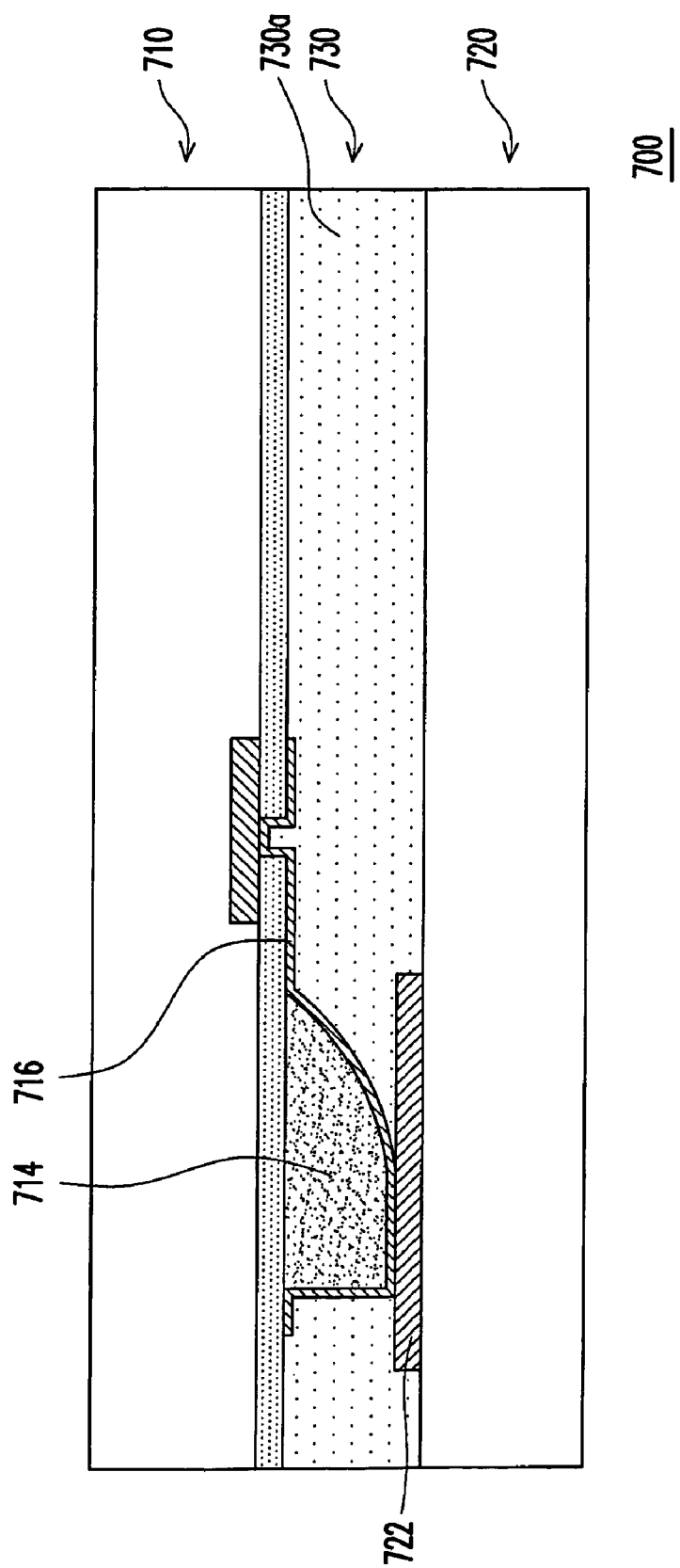
FIGS. 57 and 58 are cross-sectional views of a connecting structure according to an embodiment of the present invention.

Thereafter, referring to FIG. 57, the first substrate 710, the second substrate 720 and the bonding material 730 are laminated so that the polymer bump 714 and the conductive layer 716 penetrate through the bonding material 730 and contact the conductive structure 722 so as to form a connecting structure 700.

According to the aforementioned, the polymer bump 714 has the curve surface 714a and the steep surface 714b connected therewith. Hence, when the polymer bump 714 and the conductive layer 716 penetrate through the bonding material 730 and contact the conductive structure 722 so as to form the connecting structure 700, the polymer bump 714 having the steep surface 714b easily penetrates through the bonding material 730 to contact the conductive structure 722. Further, since the polymer bump 714 has the curve surface 714a, when the polymer bump 714 contacts the conductive structure 722, stress concentration does not occur. Accordingly, the connecting structure 700 of the polymer bump 714 has better electrical reliability.

Figure 58:
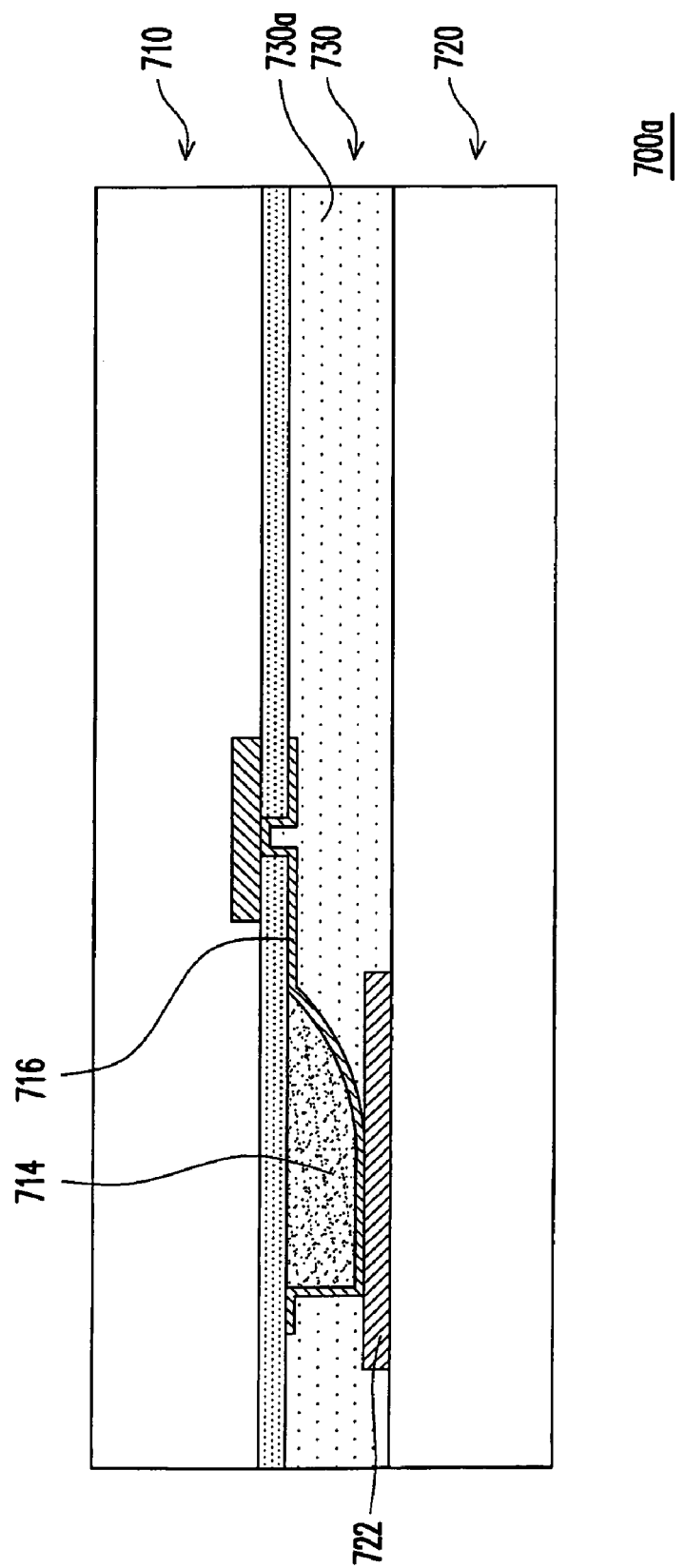

If a force applied during the said laminating process is larger, a shape of the polymer bump 714 would be slightly changed into a connecting structure 700a as illustrated in FIG. 58. Difference between the connecting structures 700 and 700a lies only in that the connecting structure 700a has a larger portion of the conductive layer 716 penetrating through the bonding material 730 along with the polymer bump 714 so as to contact the conductive structure 722.

Further, each of the foregoing contact structures as illustrated in FIGS. 39-55 is laminated with another substrate to form a connecting structure respectively. A method of forming the connecting structure is described in detail below.

Figure 59:
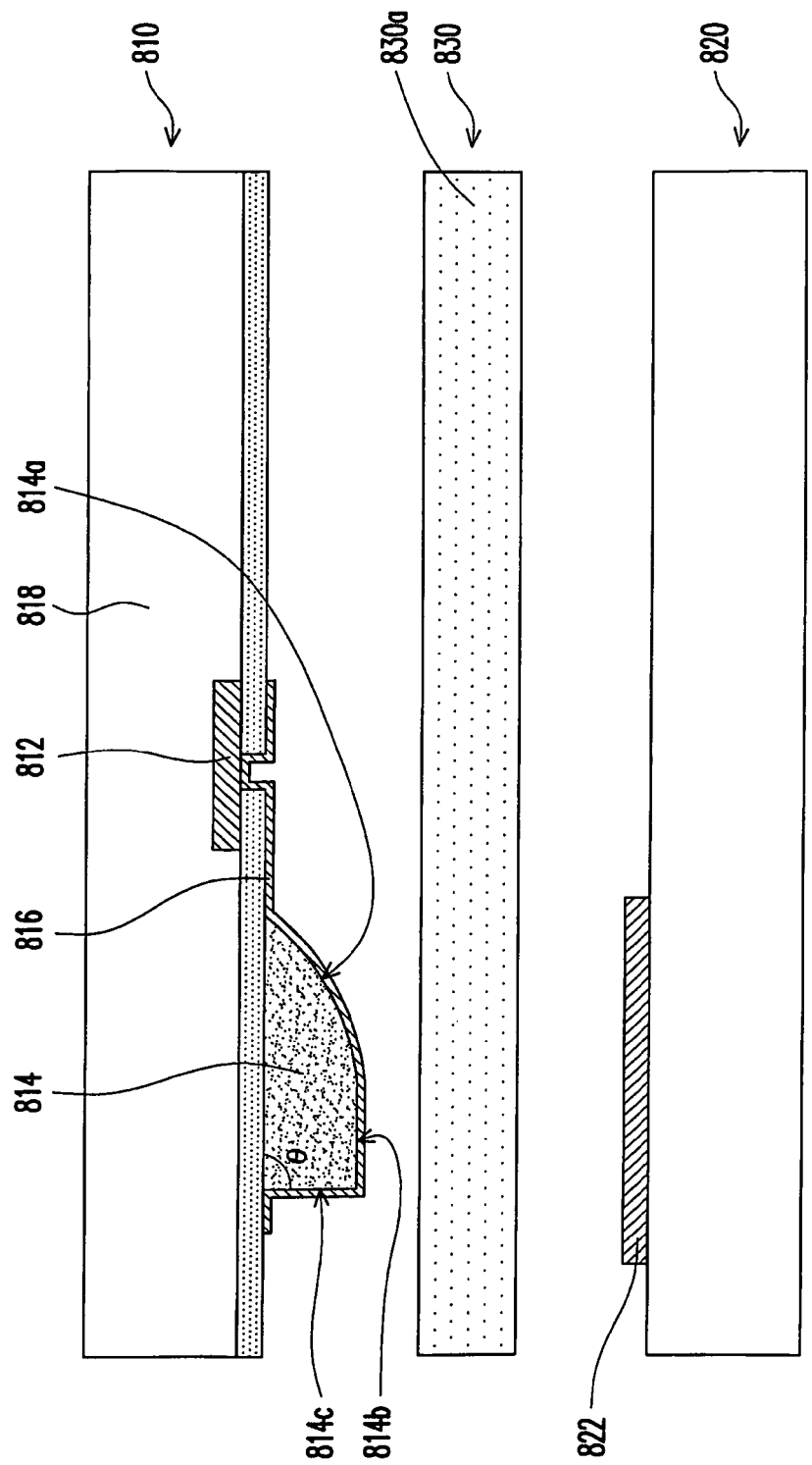
FIG. 59 is a cross-sectional view of a connecting structure before lamination according to another embodiment of the present invention.

Referring to FIG. 59, first, a first substrate 810 and a second substrate 820 are provided. The first substrate 810 includes at least one pad 812, at least one polymer bump 814 and at least one conductive layer 816. The polymer bump 814 is disposed corresponding to the pad 812 and has a curve surface 814a and a top plane 814b connected with the curve surface 814a and a steep surface 814c connected with the top plane 814b. An included angle θ between the steep surface 814c and the first substrate 810 is from 30 to 150 degrees. It should be noted that a contact structure on the first substrate 810 may be any of the contact structures as illustrated in FIGS. 39-55 and is not limited to the contact structure illustrated by FIG. 59. The conductive layer 816 covers the polymer bump 814 and electrically connects the pad 812. Further, at least one conductive structure 822 is disposed on the second substrate 820.

Then, a bonding material 830 is disposed between the first substrate 810 and the second substrate 820. Both a side having the polymer bump 814 of the first substrate 810 and a side having the conductive structure 822 of the second substrate 820 face the bonding material 830. The bonding material 830 may be a UV-cured bonding material, a thermo-cured bonding material, a thermoplastic bonding material or any combination of the aforementioned. In other words, the bonding material 830 may be a bonding material cured by UV light, a thermal curing process, a microwave curing process, an ultrasonic curing process or any combination of the foregoing curing methods. Furthermore, the bonding material 830 includes a non-conductive paste (NCP), a non-conductive film (NCF), an anisotropic conductive paste or an anisotropic conductive film. Moreover, in the present embodiment, the bonding material 830 further includes filling particles 830a distributed therein. The said filling particles 830a include conductive particles or insulating particles.

Figure 60:
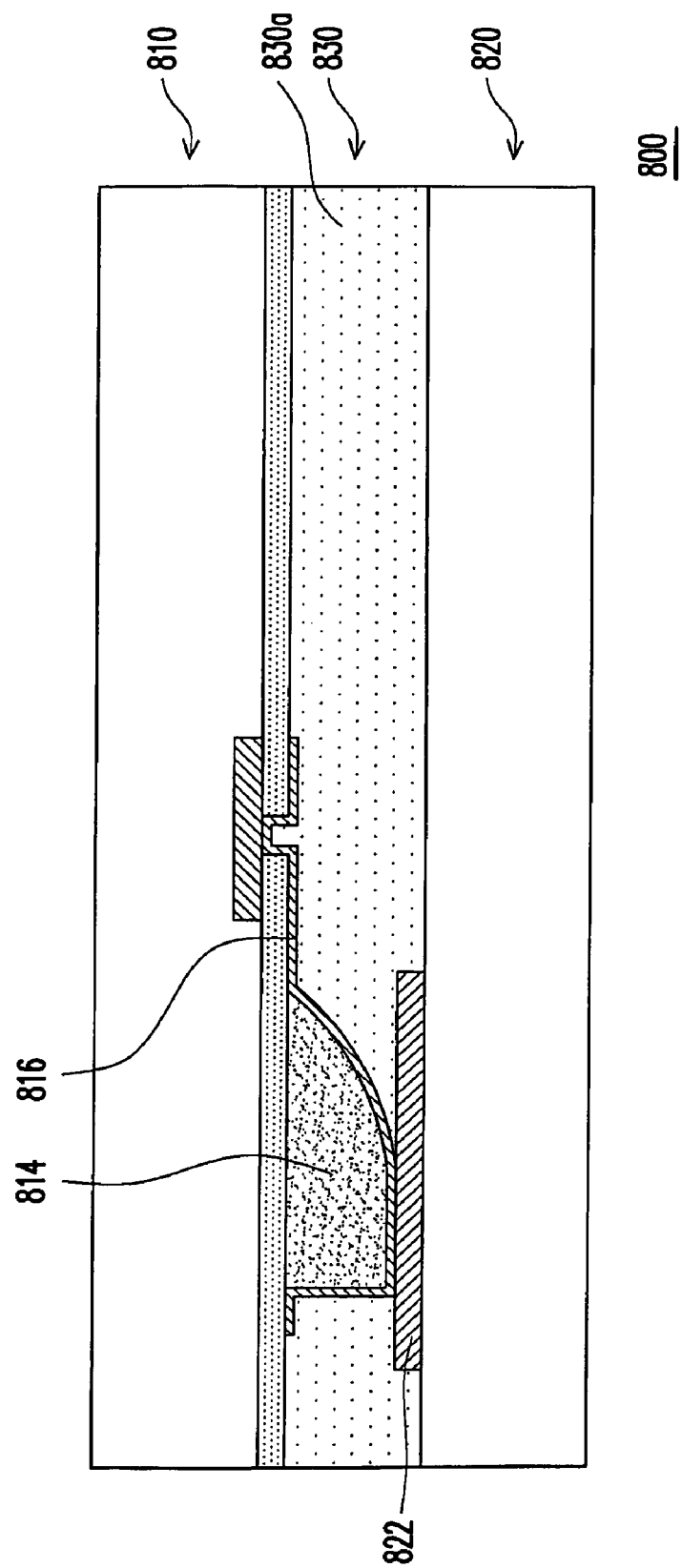
FIGS. 60 and 61 are cross-sectional views of a connecting structure according to another embodiment of the present invention.

Afterwards, referring to FIG. 60, the first substrate 810, the second substrate 820 and the bonding material 830 are laminated so that the polymer bump 814 and the conductive layer 816 penetrate through the bonding material 830 and contact the conductive structure 822 so as to form a connecting structure 800.

Figure 61:
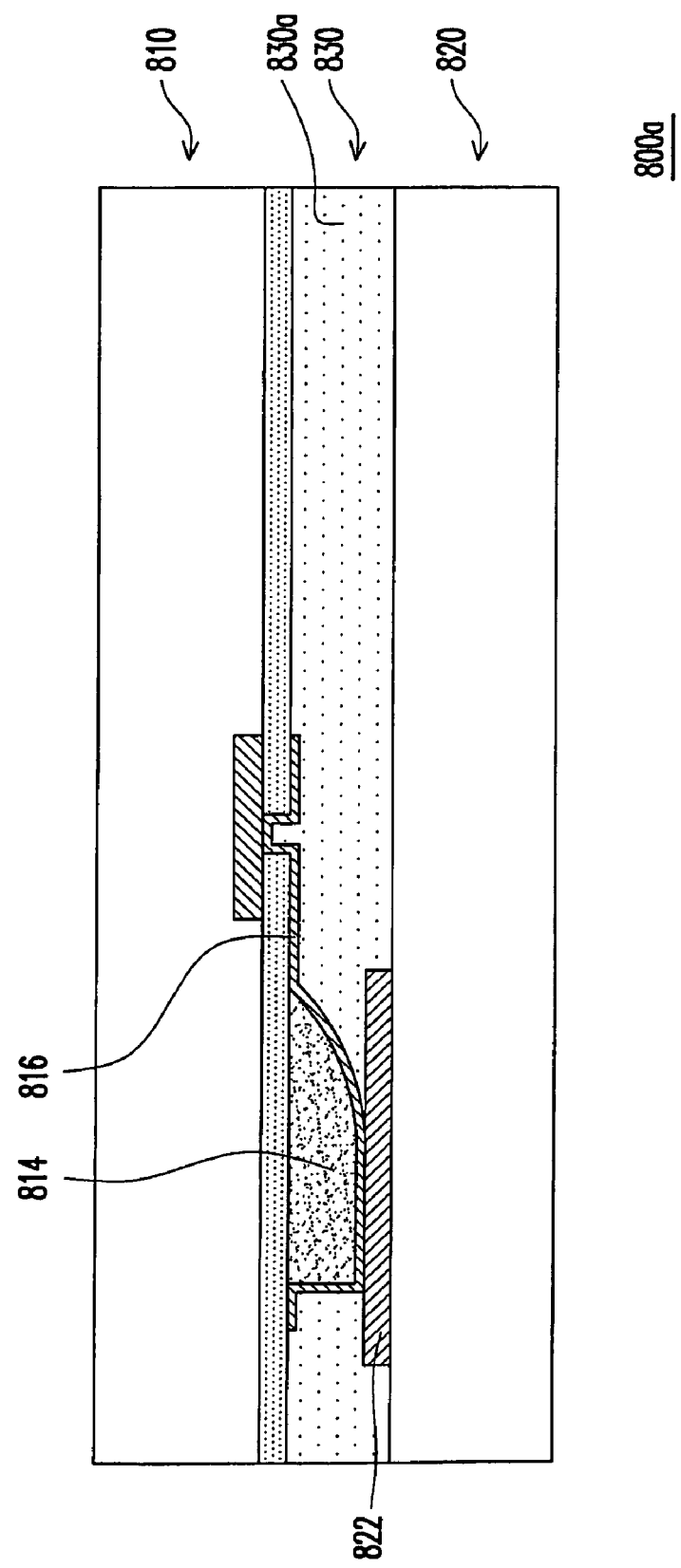

If a force applied during the said laminating process is larger, a shape of the polymer bump 814 would be slightly changed into a connecting structure 800a as illustrated in FIG. 61. Difference between the connecting structures 800 and 800a lies only in that the connecting structure 800a has a larger portion of the conductive layer 816 penetrating through the bonding material 830 along with the polymer bump 814 so as to contact the conductive structure 822.

Method of Forming Contact Structure

Methods of forming the foregoing contact structures are described in the following.

Figure 62C:
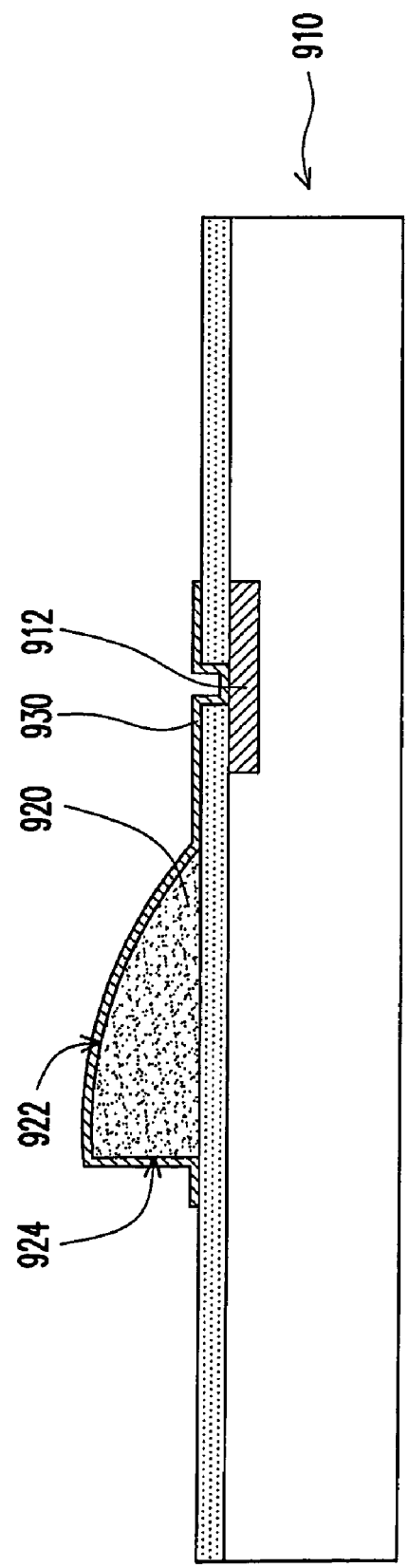

FIGS. 62A through 62C are schematic cross-sectional views illustrating a method of forming a contact structure according to an embodiment of the present invention. Referring to FIG. 60A, first, a substrate 910 is provided, and the substrate 910 has a pad 912 already formed thereon. Thereafter, referring to FIG. 62B, a polymer bump 920 is formed on the substrate 910 and has a curve surface 922 and a steep surface 924 connected therewith. An included angle θ between the steep surface 924 and the substrate 910 is from 30 to 150 degrees. Additionally, the method of forming the polymer bump 920 includes using a gray scale mask. In more detail, a photosensitive material may be used for manufacturing the polymer bump 920 and then a special gray scale mask is used to expose the photosensitive material. After development, the polymer bump 920 having the curve surface 922 and the steep surface 924 can be obtained.

Next, referring to FIG. 62C, a conductive layer 930 is formed on the substrate 910 and the conductive layer 930 covers the polymer bump 920 and contacts the pad 912. Specifically, the conductive layer 930 may be formed by a deposition process. The conductive layer 930 thus formed conformably covers a surface structure of the polymer bump 920. Therefore, a surface of the conductive layer 930 is also a curved surface. Particularly, the method of forming the contact structure as illustrated in FIGS. 62A through 62C takes that illustrated in FIG. 1 as an example for explanation. Although not every method of forming the contact structures in the embodiments of FIGS. 2-53 is illustrated, people having skill in the art should be able to understand the methods of forming the contact structure as illustrated in FIGS. 2-53 according to the description of FIGS. 62A through 62C.

Figure 63C:
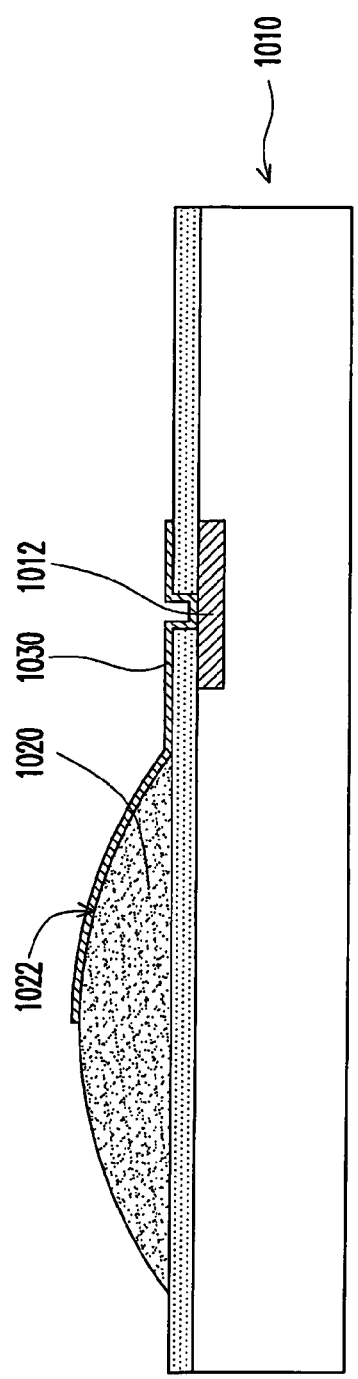
Figure 63D:
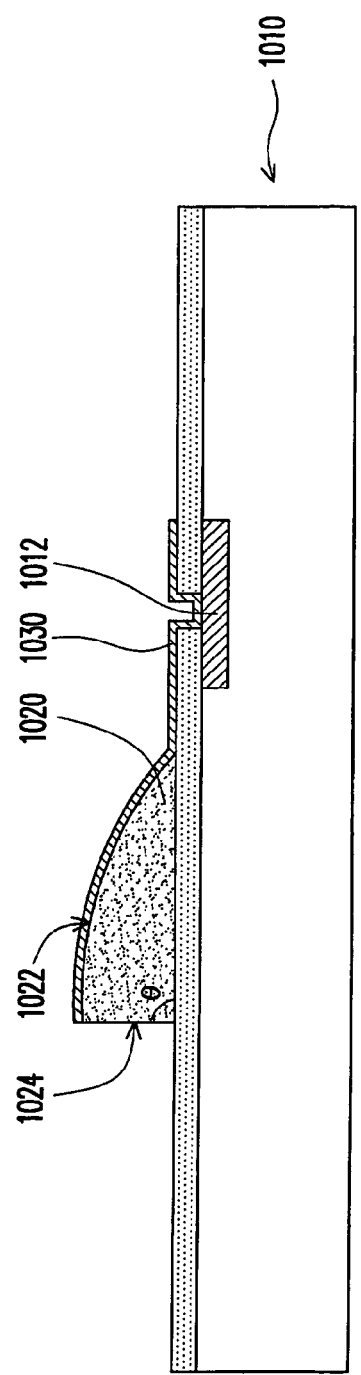

FIGS. 63A through 63D are schematic cross-sectional views illustrating a method of forming a contact structure according to another embodiment of the present invention. Referring to FIG. 63A, first, a substrate 1010 is provided, and the substrate 1010 has a pad 1012 already formed thereon. Thereafter, referring to FIG. 63B, a polymer bump 1020 is formed on the substrate 1010 and the polymer bump 1020 has a curve surface 1022. Additionally, the method of forming the polymer bump 1020 includes using a gray scale mask. In more detail, a photosensitive material may be used for manufacturing the polymer bump 1020 and then a special gray scale mask is used to expose the photosensitive material. After development, the polymer bump 1020 having the curve surface 1022 can be obtained.

Next, referring to FIG. 63C, a conductive layer 1030 is formed on the substrate 1010 and the conductive layer 1030 covers a portion of the polymer bump 1020. Afterwards, referring to FIG. 63D, the conductive layer 1030 is used as a mask to remove the polymer bump 1020 not covered by the conductive layer 1030 so as to form a steep surface 1024. An included angle θ between the steep surface 1024 and the substrate 1010 is from 30 to 150 degrees. Furthermore, a method of removing the polymer bump 1020 not covered by the conductive layer 1030 includes an exposure process and a development process or an etching process. Particularly, the method of forming the contact structures as illustrated in FIGS. 63A through 63D takes that illustrated in FIG. 7 as an example for explanation. Although not every method of forming the contact structure in the embodiments of FIGS. 8-12, 19-24, 31-36 and 46-51 is illustrated, people having skill in the art should be able to understand the methods of forming the contact structure as illustrated in FIGS. 8-12, 19-24, 31-36 and 46-51 according to the description of FIGS. 63A through 63D.

FIGS. 64A and 64B are schematic cross-sectional views of a contact structure according to another embodiment of the present invention. Referring to FIG. 64A, besides the variations in the contact structures of the foregoing embodiments, the contact structure of the present invention further includes a polymer passivation layer 120a. The polymer passivation layer 120a can be defined along with the formation of the polymer bump 120. In the embodiment of FIG. 64A, the polymer passivation layer 120a is connected with the polymer bump 120 and covers a portion of the substrate 200. In another embodiment of the present invention as illustrated in FIG. 64B, the polymer passivation layer 120a connected with the polymer bump 120 further covers a large portion of the substrate 200. Particularly, a thickness of the polymer passivation layer 120a is smaller than a thickness of the polymer bump 120. An advantage of forming the polymer passivation layer 120a is that structure strength of the polymer bump 120 is enhanced such that the polymer bump 120 does not crack easily or peel off from the substrate 200 and the component is thereby protected at the same time.

It should be mentioned that FIGS. 64A and 64B take the contact structure of FIG. 1 as an example to explain a relative position and characteristics of the polymer passivation layer 120a. However, in contact structures of the other embodiments (such as those of FIGS. 2-63), a polymer passivation layer 120a may also be designed to suit actual requirements.

Figure 65A:
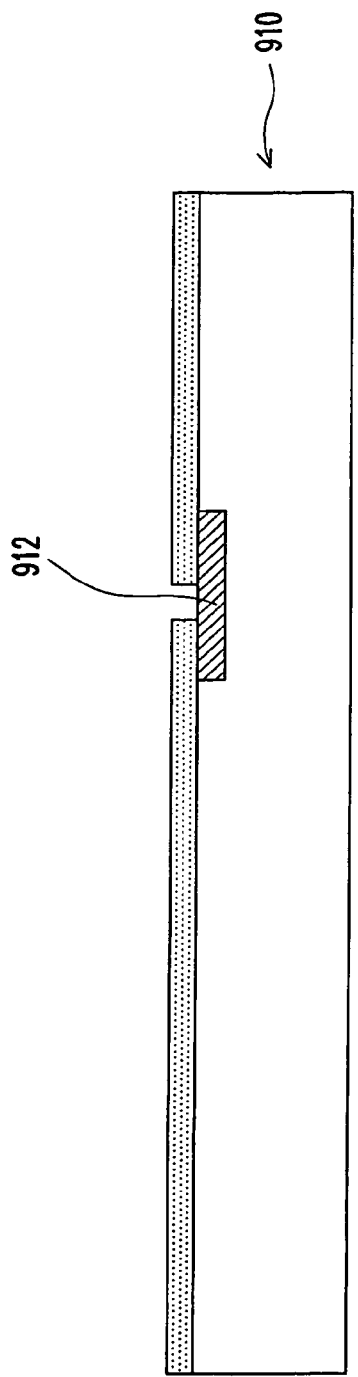
Figure 65B:
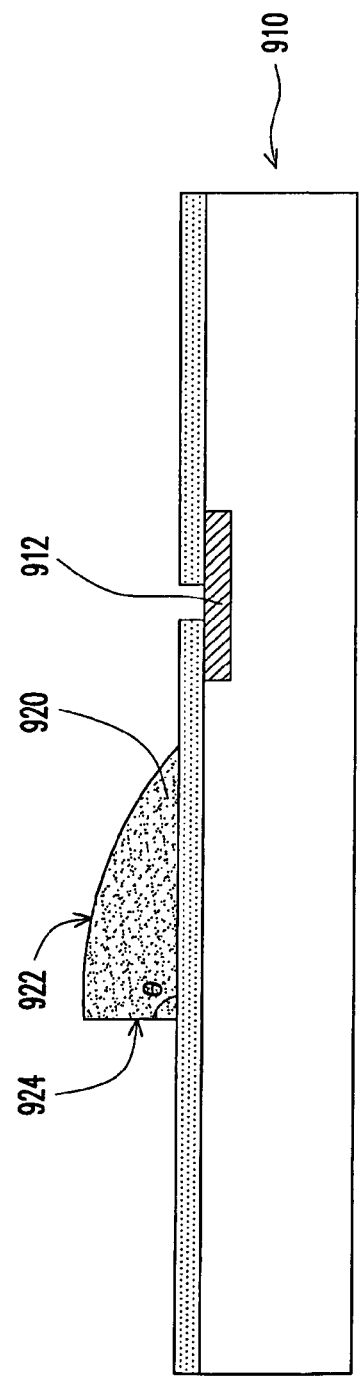

FIGS. 65A through 65G are schematic cross-sectional views illustrating a method of forming a contact structure according to an embodiment of the present invention. Steps illustrated by FIGS. 65A and 65B are the same as those illustrated by FIGS. 62A and 62B and thus are not reiterated in detail herein.

Next, referring to FIG. 65C, a conductive layer 930 is formed on the substrate 910 and the conductive layer 930 covers the polymer bump 920 and contacts the pad 912. Afterwards, as illustrated in FIG. 65D, a photoresist layer 950 is formed on the substrate 610 and exposes the polymer bump 920 and the conductive layer 930 over the pad 912. Next, referring to FIG. 65E, an electroplating procedure is performed to form a conductive layer 960 on a surface of the conductive layer 930 exposed by the photoresist layer 950. In particular, since the conductive layer 960 is formed by an electroplating procedure, a thickness of the conductive layer 960 can be easily controlled as more thick.

Thereafter, the photoresist layer 950 is removed as illustrated by FIG. 65F. Then, as illustrated in FIG. 65G, a procedure of removing the conductive layer is performed such that the thin conductive layer 930 not covered by the thick conductive layer 960 is completely removed and the thickness of the thick conductive layer 960 is also partially removed simultaneously.

Figure 65G:
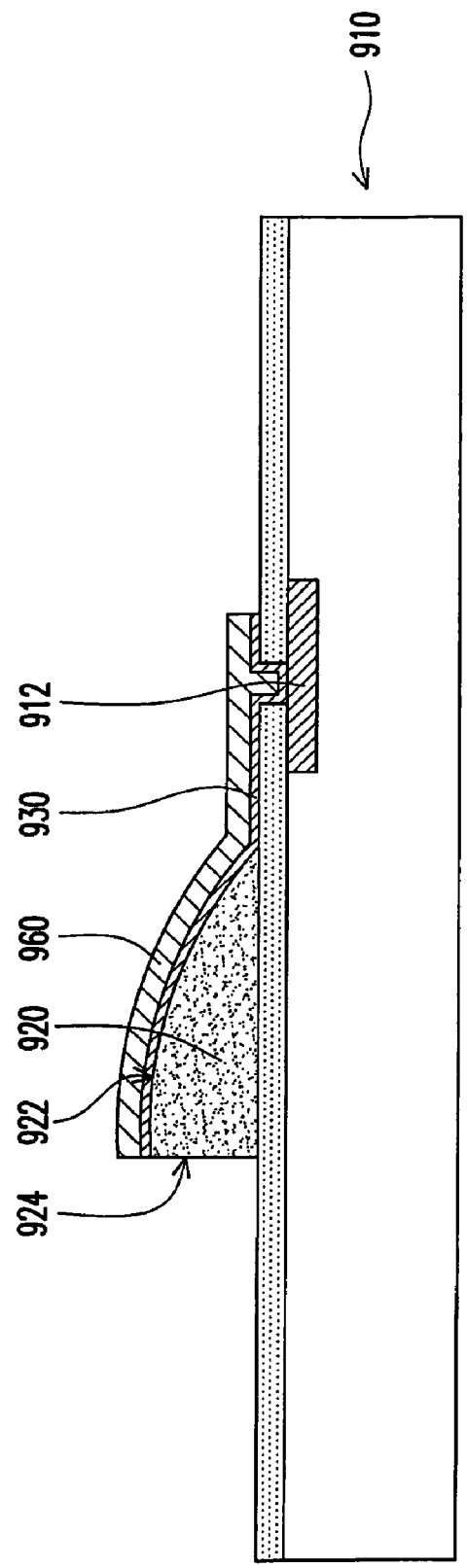

In the foregoing embodiment, since an electroplating procedure is used to form the conductive layer 960, the conductive layers 960 and 930 eventually remaining in FIG. 65G have a larger total thickness than that of conductive layers formed by deposition only. Such larger thickness enhances the conductivity of the contact structure.

According to the aforementioned, the polymer bump of the present invention has a curve surface and a steep surface. Hence, when the polymer bump contacts another substrate, the curve surface of the polymer bump prevents stress concentration and the steep surface of the polymer, bump facilitates penetration through the bonding material between the substrate and the another substrate. The polymer bump of the present invention reduces the force required by laminating the substrate (with the polymer bump disposed thereon), the bonding material and another substrate so that the polymer bump can penetrate through the bonding material. Moreover, a bounce force generated from contact between the polymer bump and the another substrate is smaller.

Furthermore, the curve surface of the polymer bump may also include a plurality of concave-convex structures. Therefore, when the polymer bump contacts another substrate, the concave-convex structures facilitate penetration through the bonding material between the substrate and the another substrate by the polymer bump. In addition, the polymer bump of the present invention may also have a curve surface, a top plane and a steep surface. The top plane increases a contact area between the conductive layer and another substrate. Lastly, the connecting structure having the contact structure of the present invention has better electrical reliability.

It will be apparent to those skilled in the art that various modifications and alterations can be made to the structure of the present invention without departing from the scope or spirit of the invention. In view of the foregoing, it is intended that the present invention cover modifications and alterations of this invention provided they fall within the scope of the following claims and their equivalents.

What is claimed is:

1. A contact structure disposed on a substrate, comprising:
at least one pad disposed on the substrate;
at least one polymer bump disposed on the substrate, the polymer bump having a bottom surface, a curve surface and a straight surface, the bottom surface being on the substrate, the curve surface having a first edge connecting with the bottom surface and a second edge connecting with the straight surface, an included angle between the straight surface and the substrate being from 30 to 150 degrees; and
at least one conductive layer covering the polymer bump and electrically connecting the pad, wherein the conductive layer covers the curve surface and the straight surface of the polymer bump and covers the substrate besides the polymer bump, and
wherein the conductive layer has at least a long side and at least a short side, and the curve surface and the straight surface of the polymer bump are both in a cross-sectional view of the polymer bump along an extending direction of the long side of the conductive layer, such that the polymer bump in said cross-sectional view is asymmetric.

2. The contact structure as claimed in claim 1, wherein the curve surface comprises a plurality of concave-convex structures.

3. The contact structure as claimed in claim 1, wherein the conductive layer wholly or partially covers the polymer bump.

4. The contact structure as claimed in claim 1, further comprising a passivation layer disposed on the substrate and exposing the pad.

5. The contact structure as claimed in claim 1, wherein the polymer bump is disposed on the pad or the substrate or crosses over the pad and the substrate simultaneously.

6. The contact structure as claimed in claim 1, wherein the curve surface of the polymer bump protrudes away from the substrate.

7. The contact structure as claimed in claim 1, wherein the curve surface of the polymer bump concaves toward the substrate.

8. The contact structure as claimed in claim 1, wherein the at least one conductive layer cover(s) the same polymer bump and electrically connect(s) the at least one pad correspondingly.

9. The contact structure as claimed in claim 1, wherein the at least one conductive layer cover(s) the same polymer bump and electrically connect(s) the same pad.

10. The contact structure as claimed in claim 1, wherein the conductive layer on the polymer bump electrically connects the at least one pad.

11. The contact structure as claimed in claim 1, wherein the at least one conductive layer on the at least one polymer bump electrically connect(s) the same pad.

12. The contact structure as claimed in claim 1, further comprising a polymer passivation layer disposed on the substrate and exposing the polymer bump and the pad.

13. The contact structure as claimed in claim 1, wherein a thickness of the polymer bump near the pad is larger than a thickness of the polymer bump far away the pad.

14. The contact structure as claimed in claim 1, wherein the straight surface of the polymer bump is perpendicular to the bottom surface of the polymer bump.

15. A contact structure disposed on a substrate, comprising:
at least one pad disposed on the substrate;
at least one polymer bump disposed on the substrate, the polymer bump having a curve surface, a top plane connected with the curve surface and a straight surface connected with the top plane, an included angle between the straight surface and the substrate being from 30 to 150 degrees; and
at least one conductive layer covering the polymer bump and electrically connecting the pad, wherein the conductive layer covers the curve surface, the top plane and the straight surface of the polymer bump and covers the substrate besides the polymer bump, and
wherein the conductive layer has at least a long side and at least a short side, and the curve surface, the top plane and the straight surface of the polymer bump are all in a cross-sectional view of the polymer bump along an extending direction of the long side of the conductive layer, and
the straight surface of the polymer bump is away from a side surface of the substrate such that the straight surface of the polymer bump is not co-planar the side surface of the substrate.

16. The contact structure as claimed in claim 15, wherein the curve surface comprises a plurality of concave-convex structures.

17. The contact structure as claimed in claim 15, wherein the conductive layer wholly or partially covers the polymer bump.

18. The contact structure as claimed in claim 15, further comprising a passivation layer disposed on the substrate and exposing the pad.

19. The contact structure as claimed in claim 15, wherein the polymer bump is disposed on the pad or the substrate or crosses over the pad and the substrate simultaneously.

20. The contact structure as claimed in claim 15, wherein the at least one conductive layer cover(s) the same polymer bump and electrically connect(s) the at least one pad correspondingly.

21. The contact structure as claimed in claim 15, wherein the at least one conductive layer cover(s) the same polymer bump and electrically connect(s) the same pad.

22. The contact structure as claimed in claim 15, wherein the conductive layer on the polymer bump electrically connects the at least one pad.

23. The contact structure as claimed in claim 15, wherein the at least one conductive layer on the at least one polymer bump electrically connect(s) the same pad.

24. The contact structure as claimed in claim 15, wherein the top plane comprises a plurality of concave-convex structures or is a smooth structure.

25. The contact structure as claimed in claim 15, further comprising a polymer passivation layer disposed on the substrate and exposing at least the polymer bump and the pad.

26. The contact structure as claimed in claim 15, wherein a thickness of the polymer bump near the pad is larger than a thickness of the polymer bump far away the pad.

27. A connecting structure, comprising:
a first substrate, comprising:
at least one pad;
at least one polymer bump disposed on the substrate, the polymer bump having a bottom surface, a curve surface and a straight surface, the bottom surface being on the substrate, the curve surface having a first edge connecting with the bottom surface and a second edge connecting with the straight surface, an included angle between the straight surface and the substrate being from 30 to 150 degrees;
at least one conductive layer covering the polymer bump and electrically connecting the pad, wherein the conductive layer covers the curve surface and the straight surface of the polymer bump and covers the substrate besides the polymer bump, and
wherein the conductive layer has at least a long side and at least a short side, and the curve surface and the straight surface of the polymer bump are both in a cross-sectional view of the polymer bump along an extending direction of the long side of the conductive layer, such that the polymer bump in said cross-sectional view is asymmetric; and
a second substrate, comprising at least one conductive structure, wherein the conductive layer on the first substrate is electrically connected with the conductive structure; and
a bonding material disposed between the first substrate and the second substrate, a portion of the conductive layer and the polymer bump penetrating through the bonding material so as to contact the conductive structure.

28. The connecting structure as claimed in claim 27, wherein the bonding material comprises an ultraviolet-cured bonding material, a thermo-cured bonding material, a thermoplastic bonding material, or a combination thereof.

29. The connecting structure as claimed in claim 27, wherein the bonding material comprises a non-conductive paste (NCP), a non-conductive film (NCF), an anisotropic conductive paste, or an anisotropic conductive film.

30. The contact structure as claimed in claim 27, wherein a thickness of the polymer bump near the pad is larger than a thickness of the polymer bump far away the pad.

31. The connecting structure as claimed in claim 27, wherein the bonding material further comprises filling particles distributed therein.

32. The connecting structure as claimed in claim 31, wherein the filling particles comprise conductive particles or insulating particles.

33. A connecting structure, comprising:
a first substrate, comprising:
at least one pad;
at least one polymer bump disposed corresponding to the pad, the polymer bump comprising a curve surface, a top plane connected with the curve surface and a straight surface connected with the top plane, an included angle between the straight surface and the substrate being from 30 to 150 degrees;
at least one conductive layer covering the polymer bump and electrically connecting the pad, wherein the conductive layer covers the curve surface, the top plane and the straight surface of the polymer bump and covers the substrate besides the polymer bump, and wherein the conductive layer has at least a long side and at least a short side, and the curve surface, the top plane and the straight surface of the polymer bump are all in a cross-sectional view of the polymer bump along an extending direction of the long side of the conductive layer, and
the straight surface of the polymer bump is away from a side surface of the substrate such that the straight surface of the polymer bump is not co-planar the side surface of the substrate; and
a second substrate, comprising at least one conductive structure, wherein the conductive layer on the first substrate is electrically connected with the conductive structure; and
a bonding material disposed between the first substrate and the second substrate, a portion of the conductive layer and the polymer bump penetrating through the bonding material so as to contact the conductive structure.

34. The connecting structure as claimed in claim 33, wherein the bonding material comprises an ultraviolet-cured bonding material, a thermo-cured bonding material, a thermoplastic bonding material, or a combination thereof.

35. The connecting structure as claimed in claim 33, wherein the bonding material comprises a non-conductive paste (NCP), a non-conductive film (NCF), an anisotropic conductive paste, or an anisotropic conductive film.

36. The connecting structure as claimed in claim 33, wherein the bonding material further comprises filling particles distributed therein.

37. The connecting structure as claimed in claim 33, wherein the filling particles comprise conductive particles or insulating particles.

38. The contact structure as claimed in claim 33, wherein a thickness of the polymer bump near the pad is larger than a thickness of the polymer bump far away the pad.

39. A method of forming a contact structure, comprising:
providing a substrate having at least one pad already formed thereon;
forming at least one polymer bump on the substrate, wherein the polymer bump has a bottom surface, a curve surface and a straight surface, the bottom surface is on the substrate, the curve surface has a first edge connecting with the bottom surface and a second edge connecting with the straight surface, and an included angle between the straight surface and the substrate being from 30 to 150 degrees;
forming a conductive layer on the substrate to cover the polymer bump and contact the pad, wherein the conductive layer covers the curve surface, the top plane and the straight surface of the polymer bump and covers the substrate besides the polymer bump, and
wherein the conductive layer has at least a long side and at least a short side, and the curve surface and the straight surface of the polymer bump are both in a cross-sectional view of the polymer bump along an extending direction of the long side of the conductive layer, such that the polymer bump in said cross-sectional view is asymmetric.

40. The method as claimed in claim 39, wherein forming the polymer bump comprises using a gray scale mask.

41. The method as claimed in claim 39, wherein forming the conductive layer comprises:
forming a first conductive layer to cover the polymer bump and the pad;
forming a photoresist layer on the first conductive layer, the photoresist layer exposing the polymer bump and the first conductive layer over the pad;
performing an electroplating procedure to form a second conductive layer on a surface of the exposed first conductive layer;
removing the photoresist layer; and
removing the first conductive layer not covered by the second conductive layer.

42. The contact structure as claimed in claim 39, wherein a thickness of the polymer bump near the pad is larger than a thickness of the polymer bump far away the pad.

* * * * *